(12) United States Patent
Sharangpani et al.

(10) Patent No.: US 11,594,553 B2
(45) Date of Patent: Feb. 28, 2023

(54) THREE-DIMENSIONAL FERROELECTRIC MEMORY DEVICE CONTAINING LATTICE-MATCHED TEMPLATES AND METHODS OF MAKING THE SAME

(71) Applicant: SANDISK TECHNOLOGIES LLC, Addison, TX (US)

(72) Inventors: Rahul Sharangpani, Fremont, CA (US); Raghuveer S. Makala, Campbell, CA (US); Fei Zhou, San Jose, CA (US); Adarsh Rajashekhar, Santa Clara, CA (US)

(73) Assignee: SANDISK TECHNOLOGIES LLC, Addison, TX (US)

( * ) Notice: Subject to any disclaimer, the term of this patent is extended or adjusted under 35 U.S.C. 154(b) by 2 days.

(21) Appl. No.: 17/150,561

(22) Filed: Jan. 15, 2021

(65) Prior Publication Data
US 2022/0231048 A1    Jul. 21, 2022

(51) Int. Cl.
*H01L 27/11597* (2017.01)
*H01L 27/1159* (2017.01)
*H01L 27/11587* (2017.01)
*H01L 27/11563* (2017.01)
*H01L 27/11578* (2017.01)
*H01L 27/11582* (2017.01)

(52) U.S. Cl.
CPC .... *H01L 27/11597* (2013.01); *H01L 27/1159* (2013.01); *H01L 27/11563* (2013.01); *H01L 27/11578* (2013.01); *H01L 27/11582* (2013.01); *H01L 27/11587* (2013.01)

(58) Field of Classification Search
CPC ......... H01L 27/11563; H01L 27/11578; H01L 27/11582; H01L 27/11587; H01L 27/1159; H01L 27/11597
See application file for complete search history.

(56) References Cited

U.S. PATENT DOCUMENTS

| | | |
|---|---|---|
| 9,941,299 B1 | 4/2018 | Chen et al. |
| 10,700,093 B1 | 6/2020 | Kalitsov et al. |

(Continued)

FOREIGN PATENT DOCUMENTS

| | | | | |
|---|---|---|---|---|
| CN | 112652630 A | * | 4/2021 | ............. G11C 16/10 |
| KR | 10-2018-0059271 | | 6/2018 | |
| KR | 10-1872122 A | | 6/2018 | |

OTHER PUBLICATIONS

Notification of Transmittal of the International Search Report and the Written Opinion of the International Searching Authority for International Patent Application No. PCT/US2021/036870, dated Oct. 20, 2021, 11 pages.

(Continued)

*Primary Examiner* — Matthew E Warren
(74) *Attorney, Agent, or Firm* — The Marbury Law Law Group PLLC

(57) ABSTRACT

A ferroelectric memory device includes an alternating stack of insulating layers and electrically conductive layers, a memory opening vertically extending through the alternating stack, and a memory opening fill structure located in the memory opening and containing a vertical stack of memory elements and a vertical semiconductor channel. Each memory element within the vertical stack of memory elements includes a crystalline ferroelectric memory material portion and an epitaxial template portion.

20 Claims, 27 Drawing Sheets

(56) References Cited

U.S. PATENT DOCUMENTS

| | | | |
|---|---|---|---|
| 10,811,431 | B1 | 10/2020 | Makala et al. |
| 10,833,101 | B2 | 11/2020 | Shimomura et al. |
| 10,868,042 | B1 | 12/2020 | Zhang et al. |
| 2014/0070290 | A1 | 3/2014 | Inumiya et al. |
| 2018/0102374 | A1 | 4/2018 | Chavan et al. |
| 2020/0051607 | A1 | 2/2020 | Pan et al. |
| 2020/0119047 | A1* | 4/2020 | Yoo .................. H01L 27/11597 |
| 2020/0227439 | A1 | 7/2020 | Sato |
| 2020/0365618 | A1 | 7/2020 | Zhang et al. |
| 2020/0312950 | A1* | 10/2020 | Haratipour ........ H01L 27/11585 |
| 2021/0036019 | A1* | 2/2021 | Sharangpani ..... H01L 27/11587 |
| 2021/0082955 | A1* | 3/2021 | Rajash .............. H01L 27/11587 |

OTHER PUBLICATIONS

U.S. Appl. No. 16/249,300, filed Jan. 16, 2019, SanDisk Technologies LLC.
U.S. Appl. No. 16/412,764, filed May 15, 2019, SanDisk Technologies LLC.
U.S. Appl. No. 16/454,458, filed Jun. 27, 2019, SanDisk Technologies LLC.
U.S. Appl. No. 16/454,475, filed Jun. 27, 2019, SanDisk Technologies LLC.
U.S. Appl. No. 16/456,736, filed Jun. 28, 2019, SanDisk Technologies LLC.
U.S. Appl. No. 16/530,256, filed Aug. 2, 2019, SanDisk Technologies LLC.
U.S. Appl. No. 16/541,289, filed Aug. 15, 2019, SanDisk Technologies LLC.
U.S. Appl. No. 16/568,668, filed Sep. 12, 2019, SanDisk Technologies LLC.
U.S. Appl. No. 16/577,176, filed Sep. 20, 2019, SanDisk Technologies LLC.
U.S. Appl. No. 16/694,340, filed Nov. 25, 2019, SanDisk Technologies LLC.
U.S. Appl. No. 16/707,036, filed Dec. 9, 2019, SanDisk Technologies LLC.
U.S. Appl. No. 16/728,825, filed Dec. 27, 2019, SanDisk Technologies LLC.
U.S. Appl. No. 16/737,088, filed Jan. 8, 2020, SanDisk Technologies LLC.
U.S. Appl. No. 16/738,644, filed Jan. 9, 2020, SanDisk Technologies LLC.
U.S. Appl. No. 16/743,436, filed Jan. 15, 2020, SanDisk Technologies LLC.
U.S. Appl. No. 16/910,638, filed Jun. 24, 2020, SanDisk Technologies LLC.
U.S. Appl. No. 16/913,717, filed Jun. 26, 2020, SanDisk Technologies LLC.
U.S. Appl. No. 16/913,766, filed Jun. 26, 2020, SanDisk Technologies LLC.
U.S. Appl. No. 17/081,122, filed Oct. 27, 2020, SanDisk Technologies LLC.
U.S. Appl. No. 17/081,147, filed Oct. 27, 2020, SanDisk Technologies LLC.
U.S. Appl. No. 17/097,757, filed Nov. 13, 2020, SanDisk Technologies LLC.
U.S. Appl. No. 17/097,841, filed Nov. 13, 2020, SanDisk Technologies LLC.
U.S. Appl. No. 17/122,360, filed Dec. 15, 2020, SanDisk Technologies LLC.

* cited by examiner

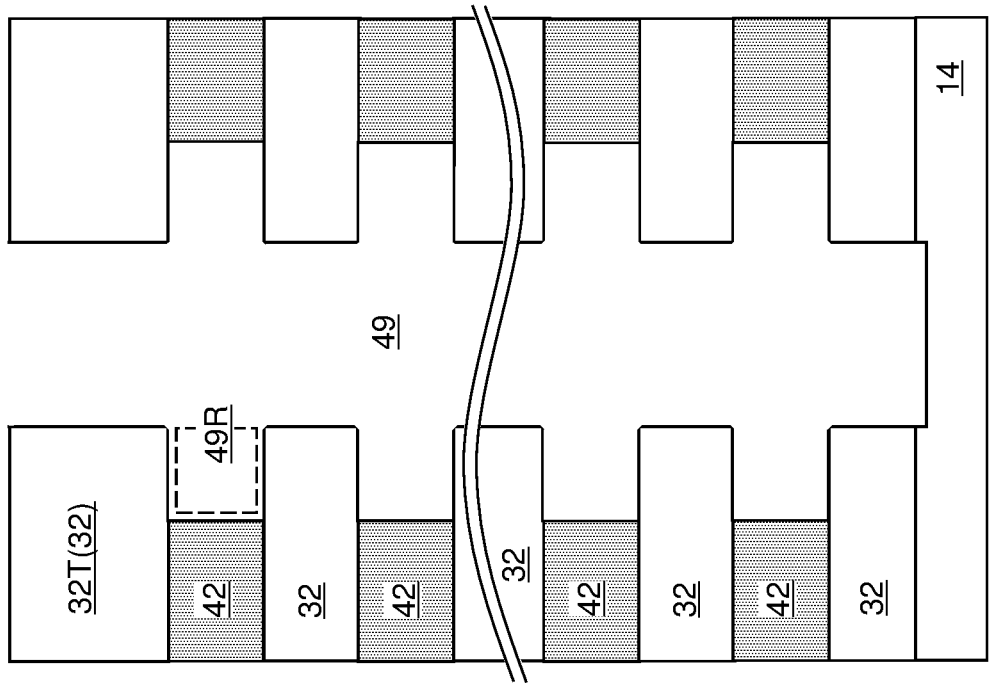
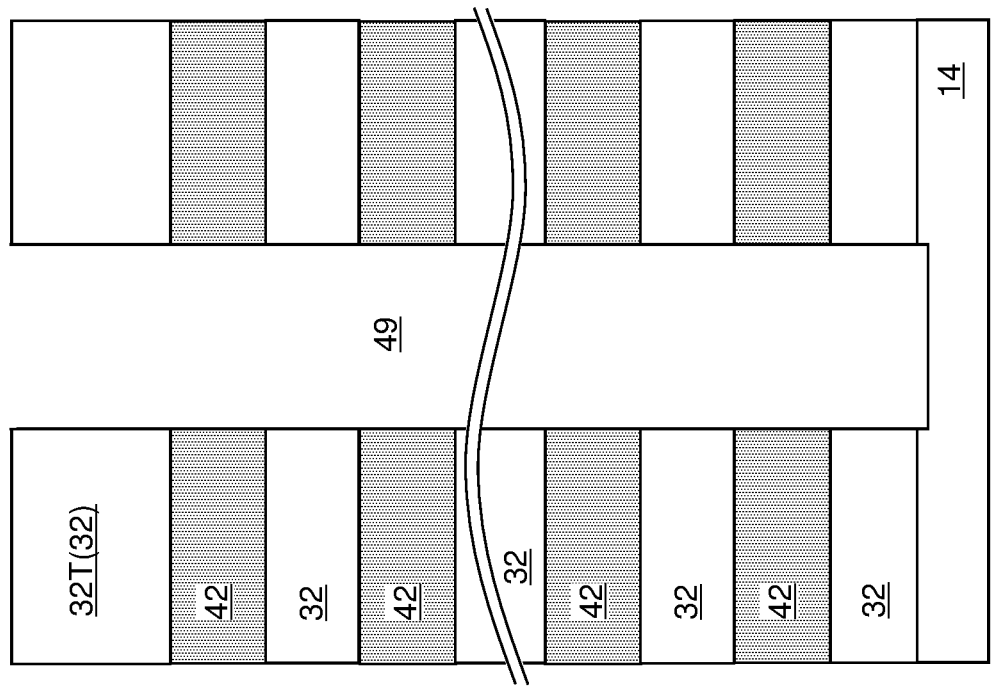

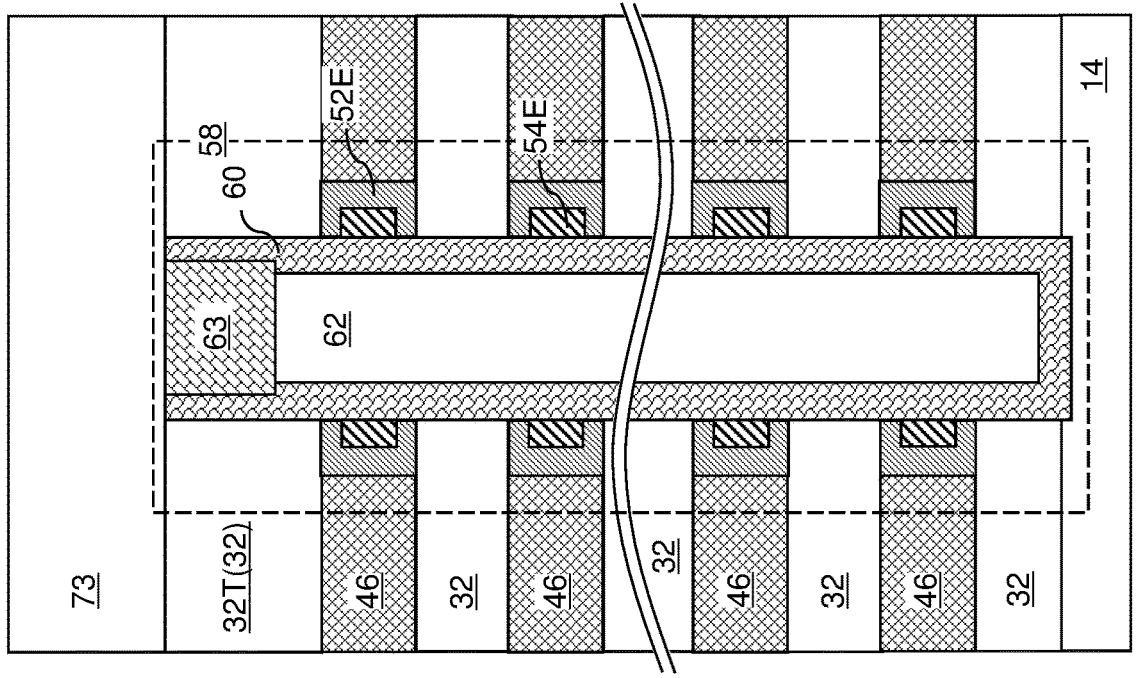
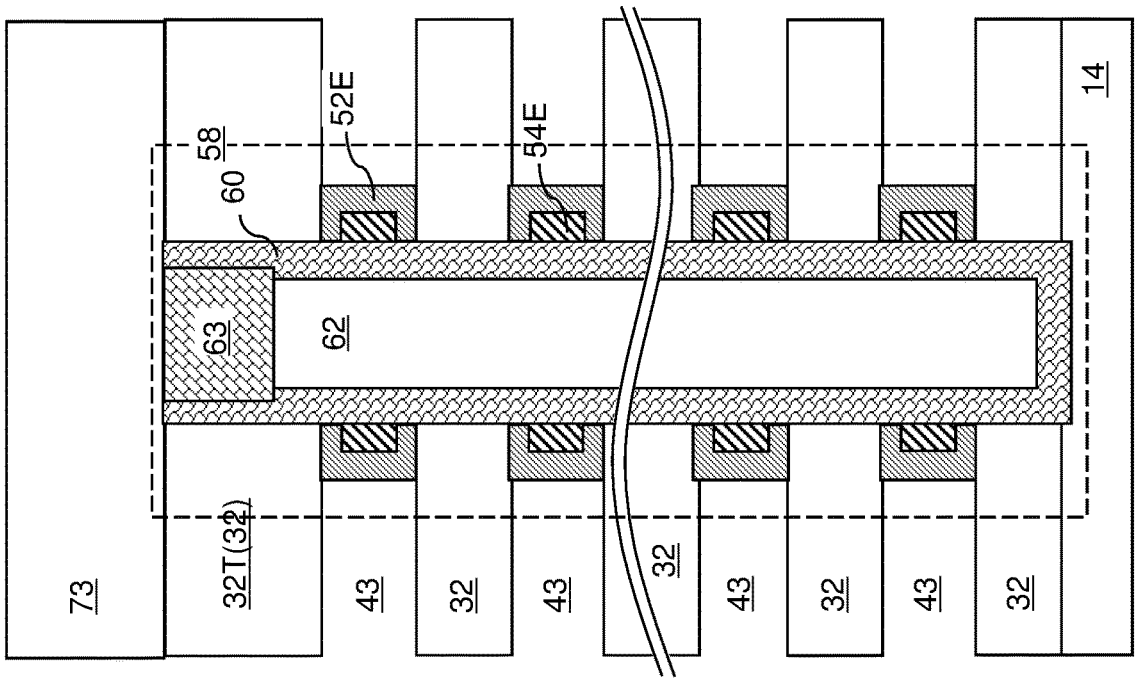
FIG. 12A
FIG. 12B

THREE-DIMENSIONAL FERROELECTRIC MEMORY DEVICE CONTAINING LATTICE-MATCHED TEMPLATES AND METHODS OF MAKING THE SAME

FIELD

The present disclosure relates generally to the field of solid state devices, and particularly to a three-dimensional ferroelectric memory device containing templates for ferroelectric memory elements and methods of manufacturing the same.

BACKGROUND

A ferroelectric material refers to a material that displays spontaneous polarization of electrical charges in the absence of an applied electric field. The net polarization P of electrical charges within the ferroelectric material is non-zero in the minimum energy state. Thus, spontaneous ferroelectric polarization of the material occurs, and the ferroelectric material accumulates surfaces charges of opposite polarity types on two opposing surfaces. Polarization P of a ferroelectric material as a function of an applied voltage V thereacross displays hysteresis. The product of the remanent polarization and the coercive field of a ferroelectric material is a metric for characterizing effectiveness of the ferroelectric material.

A ferroelectric memory device is a memory device containing the ferroelectric material which is used to store information. The ferroelectric material acts as the memory material of the memory device. The dipole moment of the ferroelectric material is programmed in two different orientations (e.g., "up" or "down" polarization positions based on atom positions, such as oxygen and/or metal atom positions, in the crystal lattice) depending on the polarity of the applied electric field to the ferroelectric material to store information in the ferroelectric material. The different orientations of the dipole moment of the ferroelectric material may be detected by the electric field generated by the dipole moment of the ferroelectric material.

SUMMARY

According to an aspect of the present disclosure, a ferroelectric memory device includes an alternating stack of insulating layers and electrically conductive layers, a memory opening vertically extending through the alternating stack, and a memory opening fill structure located in the memory opening and containing a vertical stack of memory elements and a vertical semiconductor channel. Each memory element within the vertical stack of memory elements includes a crystalline ferroelectric memory material portion and an epitaxial template portion.

According to another aspect of the present disclosure, a method of forming a ferroelectric memory device includes forming an alternating stack of insulating layers and sacrificial material layers over a substrate, forming a memory opening through the alternating stack, forming lateral recesses by laterally recessing sidewalls of the sacrificial material layers around the memory opening, forming an epitaxial template portion in each of the lateral recesses, forming a crystalline ferroelectric memory material portion on each of the epitaxial template portions, wherein each of the crystalline ferroelectric memory material portions is epitaxially aligned to a respective one of the epitaxial template portions, and replacing the sacrificial material layers with electrically conductive layers.

BRIEF DESCRIPTION OF THE DRAWINGS

FIGS. 4A-4J are sequential vertical cross-sectional views of a memory opening during formation of a memory opening fill structure in a first configuration according to an embodiment of the present disclosure.

FIGS. 12A and 12B are sequential vertical cross-sectional views of a memory opening including a memory opening fill structure in a third configuration during replacement of sacrificial material layers with electrically conductive layers according to an embodiment of the present disclosure.

DETAILED DESCRIPTION

Figure 1:
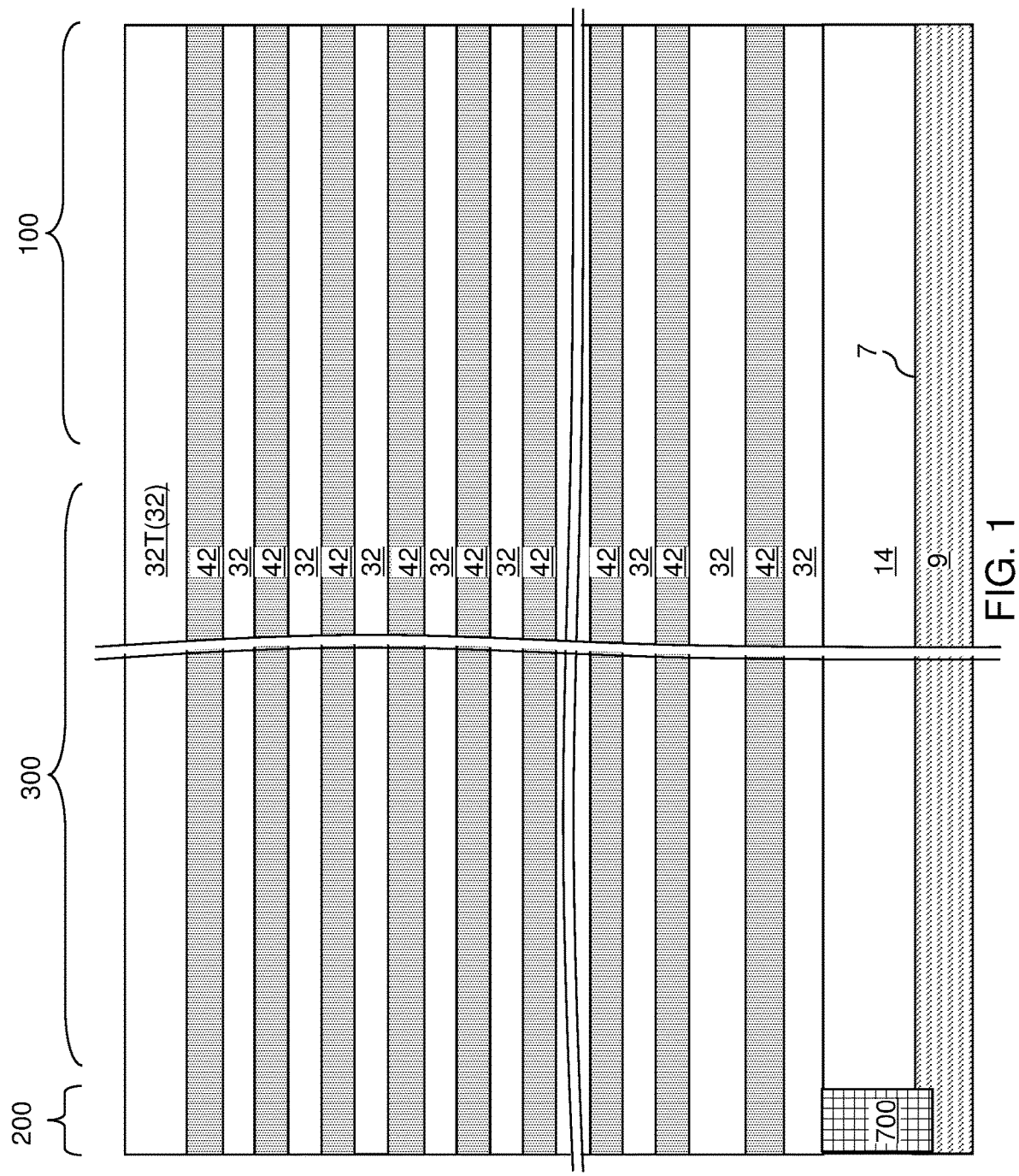
FIG. 1 is a schematic vertical cross-sectional view of an exemplary structure after formation of an alternating stack of insulating layers and sacrificial material layers according to an embodiment of the present disclosure.

As discussed above, the embodiments of the present disclosure are directed to a three-dimensional ferroelectric memory device containing lattice-matched templates for depositing crystalline ferroelectric memory elements and methods of manufacturing the same, the various aspects of which are described below.

The drawings are not drawn to scale. Multiple instances of an element may be duplicated where a single instance of the element is illustrated, unless absence of duplication of elements is expressly described or clearly indicated otherwise. Ordinals such as "first," "second," and "third" are employed merely to identify similar elements, and different ordinals may be employed across the specification and the claims of the instant disclosure. The term "at least one" element refers to all possibilities including the possibility of a single element and the possibility of multiple elements.

The same reference numerals refer to the same element or similar element. Unless otherwise indicated, elements having the same reference numerals are presumed to have the same composition and the same function. Unless otherwise indicated, a "contact" between elements refers to a direct contact between elements that provides an edge or a surface shared by the elements. If two or more elements are not in direct contact with each other or from each other, the two elements are "disjoined from" each other. As used herein, a first element located "on" a second element can be located on the exterior side of a surface of the second element or on the interior side of the second element. As used herein, a first element is located "directly on" a second element if there exist a physical contact between a surface of the first element and a surface of the second element. As used herein, a first element is "electrically connected to" a second element if there exists a conductive path consisting of at least one conductive material between the first element and the second element. As used herein, a "prototype" structure or an "in-process" structure refers to a transient structure that is subsequently modified in the shape or composition of at least one component therein.

As used herein, a "layer" refers to a material portion including a region having a thickness. A layer may extend over the entirety of an underlying or overlying structure, or may have an extent less than the extent of an underlying or overlying structure. Further, a layer may be a region of a homogeneous or inhomogeneous continuous structure that has a thickness less than the thickness of the first continuous structure. For example, a layer may be located between any pair of horizontal planes between, or at, a top surface and a bottom surface of the first continuous structure. A layer may extend horizontally, vertically, and/or along a tapered surface. A substrate may be a layer, may include one or more layers therein, or may have one or more layer thereupon, thereabove, and/or therebelow.

As used herein, a first surface and a second surface are "vertically coincident" with each other if the second surface overlies or underlies the first surface and there exists a vertical plane or a substantially vertical plane that includes the first surface and the second surface. A substantially vertical plane is a plane that extends straight along a direction that deviates from a vertical direction by an angle less than 5 degrees. A vertical plane or a substantially vertical plane is straight along a vertical direction or a substantially vertical direction, and may, or may not, include a curvature along a direction that is perpendicular to the vertical direction or the substantially vertical direction.

Ferroelectricity occurs only in a nonsymmetric (polar) crystalline phase of a dielectric material that has two asymmetric crystalline configurations that generate different dipole moments. Thus, a dielectric material may have a nonpolar phase that does not provide ferroelectricity and a polar phase that provides ferroelectricity. In an illustrative example, hafnium zirconium oxide (HZO) (also known as zirconium doped hafnium oxide) has a non-polar monoclinic phase (m-phase) that is stable within a bulk structure at room temperature, a non-polar tetragonal and cubic phases (t-phase and c-phase) that are stable at high temperature, and a polar orthorhombic phase (o-phase) that is a metastable phase and stable under hydrostatic pressure of about 3-4 GPa or under stain and/or doping (e.g., zirconium doping of hafnium oxide).

Typically, prior art ferroelectric hafnia-based compounds were grown by atomic layer deposition (ALD), which produces polycrystalline hafnia-based ferroelectric films. A polycrystalline structure of a ferroelectric film reduces the total polarization due to reduction in ferroelectric contribution caused by random orientation of the grains of the ferroelectric material, and also limits the domain switching speed.

Embodiments of the present disclosure provide epitaxial ferroelectric memory elements that are formed employing a single crystalline or highly textured polycrystalline crystallization templates. Each epitaxial ferroelectric memory element may have large ferroelectric grains or may be single crystalline. Generally, a predominant volume fraction (i.e., more than 50%) of the ferroelectric memory elements (such as more than 70% and/or more than 80% and/or more than 90% in volume fraction) may be oriented such that the dipole moment is parallel to the direction of the electrical field to be subsequently applied, and the remanent polarization can be increased in memory devices of the embodiments of the present disclosure relative to polycrystalline ferroelectric films having random crystallographic grain orientations that are employed in the prior art.

In one embodiment, a three-dimensional ferroelectric memory device contains a memory element comprising a doped non-centrosymmetric (i.e., without inversion symmetry) orthorhombic hafnium oxide ferroelectric single crystalline material with a textured crystallographic orientation (i.e., an orientation in which the dipole moment is aligned along the direction of the electrical field to be applied). Such single crystalline material has a higher effective dipole moment, and thus a higher remnant polarization (Pr) than polycrystalline material.

Referring to FIG. 1, an exemplary structure according to an embodiment of the present disclosure is illustrated, which can be employed, for example, to fabricate a three-dimensional ferroelectric memory array, which may comprise a three dimensional ferroelectric NAND array. The exemplary structure includes a substrate 9. The substrate 9 maybe a semiconductor wafer (e.g., single crystal silicon wafer), an insulating substrate (e.g., glass, ceramic or polymer substrate), or a conductive substrate (e.g., metal substrate). The substrate 9 can have a major surface 7, which can be, for example, a topmost surface of the substrate 9. The major surface 7 can be a semiconductor surface. In one embodiment, the major surface 7 can be a single crystalline semiconductor surface, such as a single crystalline semiconductor surface.

An optional semiconductor layer 14 can be located on the top surface 7 of the substrate 9. The semiconductor layer 14 may comprise a silicon layer which may be deposited on the top surface of the substrate 9 or may comprise a doped semiconductor well formed in the top surface 7 of the substrate 9 if the substrate comprises a silicon wafer.

At least one peripheral device 700 for a peripheral circuitry can be formed on a portion of the substrate 9. The at least one semiconductor device can include, for example, field effect transistors. The at least one peripheral device 700 can comprise a driver circuit for controlling operation of memory devices to be subsequently formed.

The region (i.e., area) of the at least one peripheral device 700 is herein referred to as a peripheral device region 200. The region in which a memory array is subsequently formed is herein referred to as a memory array region 100. A staircase region 300 for subsequently forming stepped terraces of electrically conductive layers can be provided between the memory array region 100 and the peripheral device region 200.

In one alternative embodiment, the peripheral device region 200 containing the at least one peripheral device 700 for a peripheral circuitry may be located under the memory array region 100 in a CMOS under array configuration. In another alternative embodiment shown in FIG. 14 and described in more detail below, the peripheral device region 200 may be located on a separate substrate which is subsequently bonded to the memory array region 100.

A stack of an alternating plurality of first material layers (which can be insulating layers 32) and second material layers (which can be sacrificial material layers 42) is formed over the top surface of the semiconductor layer 14. As used herein, an alternating plurality of first elements and second elements refers to a structure in which instances of the first elements and instances of the second elements alternate. Each instance of the first elements that is not an end element of the alternating plurality is adjoined by two instances of the second elements on both sides, and each instance of the second elements that is not an end element of the alternating plurality is adjoined by two instances of the first elements on both ends. The first elements may have the same thickness thereamongst, or may have different thicknesses. The second elements may have the same thickness thereamongst, or may have different thicknesses. The alternating plurality of first material layers and second material layers may begin with an instance of the first material layers or with an instance of the second material layers, and may end with an instance of the first material layers or with an instance of the second material layers. In one embodiment, an instance of the first elements and an instance of the second elements may form a unit that is repeated with periodicity within the alternating plurality.

Each first material layer includes a first material, and each second material layer includes a second material that is different from the first material. In one embodiment, each first material layer can be an insulating layer 32, and each second material layer can be a sacrificial material layer. In this case, the stack can include an alternating plurality of insulating layers 32 and sacrificial material layers 42, and constitutes a prototype stack of alternating layers comprising insulating layers 32 and sacrificial material layers 42.

The stack of the alternating plurality is herein referred to as an alternating stack (32, 42). In one embodiment, the alternating stack (32, 42) can include insulating layers 32 composed of the first material, and sacrificial material layers 42 composed of a second material different from that of insulating layers 32. The first material of the insulating layers 32 can be at least one insulating material. As such, each insulating layer 32 can be an insulating material layer. Insulating materials that can be employed for the insulating layers 32 include, but are not limited to, silicon oxide (including doped or undoped silicate glass), silicon nitride, silicon oxynitride, organosilicate glass (OSG), spin-on dielectric materials, dielectric metal oxides that are commonly known as high dielectric constant (high-k) dielectric oxides (e.g., aluminum oxide, hafnium oxide, etc.) and silicates thereof, dielectric metal oxynitrides and silicates thereof, and organic insulating materials. In one embodiment, the first material of the insulating layers 32 can be silicon oxide.

The second material of the sacrificial material layers 42 is a sacrificial material that can be removed selective to the first material of the insulating layers 32. As used herein, a removal of a first material is "selective to" a second material if the removal process removes the first material at a rate that is at least twice the rate of removal of the second material. The ratio of the rate of removal of the first material to the rate of removal of the second material is herein referred to as a "selectivity" of the removal process for the first material with respect to the second material.

The sacrificial material layers 42 may comprise an insulating material, a semiconductor material, or a conductive material. The second material of the sacrificial material layers 42 can be subsequently replaced with electrically conductive electrodes which can function, for example, as word lines of the memory device. Non-limiting examples of the second material include silicon nitride, an amorphous semiconductor material (such as amorphous silicon), and a polycrystalline semiconductor material (such as polysilicon). In one embodiment, the sacrificial material layers 42 can be spacer material layers that comprise silicon nitride or a semiconductor material including at least one of silicon and germanium.

In one embodiment, the insulating layers 32 can include silicon oxide, and sacrificial material layers can include silicon nitride sacrificial material layers. The first material of the insulating layers 32 can be deposited, for example, by chemical vapor deposition (CVD). For example, if silicon oxide is employed for the insulating layers 32, tetraethyl orthosilicate (TEOS) can be employed as the precursor material for the CVD process. The second material of the sacrificial material layers 42 can be formed, for example, CVD or atomic layer deposition (ALD).

The sacrificial material layers 42 can be suitably patterned so that conductive material portions to be subsequently formed by replacement of the sacrificial material layers 42 can function as electrically conductive electrodes (such as word lines of the memory devices to be subsequently formed). The sacrificial material layers 42 may comprise a portion having a strip shape extending substantially parallel to the major surface 7 of the substrate.

The thicknesses of the insulating layers 32 and the sacrificial material layers 42 can be in a range from 20 nm to 50 nm, although lesser and greater thicknesses can be employed for each insulating layer 32 and for each sacrificial material layer 42. The number of repetitions of the pairs of an insulating layer 32 and a sacrificial material layer 42 can be in a range from 2 to 1,024, and typically from 8 to 256, although a greater number of repetitions can also be employed. In one embodiment, each sacrificial material layer 42 in the alternating stack (32, 42) can have a uniform thickness that is substantially invariant within each respective sacrificial material layer 42. A topmost insulating layer 32T, which is a topmost one of the insulating layers 32, can have a greater thickness than insulating layers 32 located between an overlying sacrificial material layer 42 and an underlying sacrificial material layer 32.

While the present disclosure is described employing an embodiment in which the spacer material layers are sacrificial material layers 42 that are subsequently replaced with electrically conductive layers, embodiments are expressly contemplated herein in which the sacrificial material layers are formed as electrically conductive layers (e.g., word lines). In this case, steps for replacing the spacer material layers with electrically conductive layers can be omitted.

Figure 2:
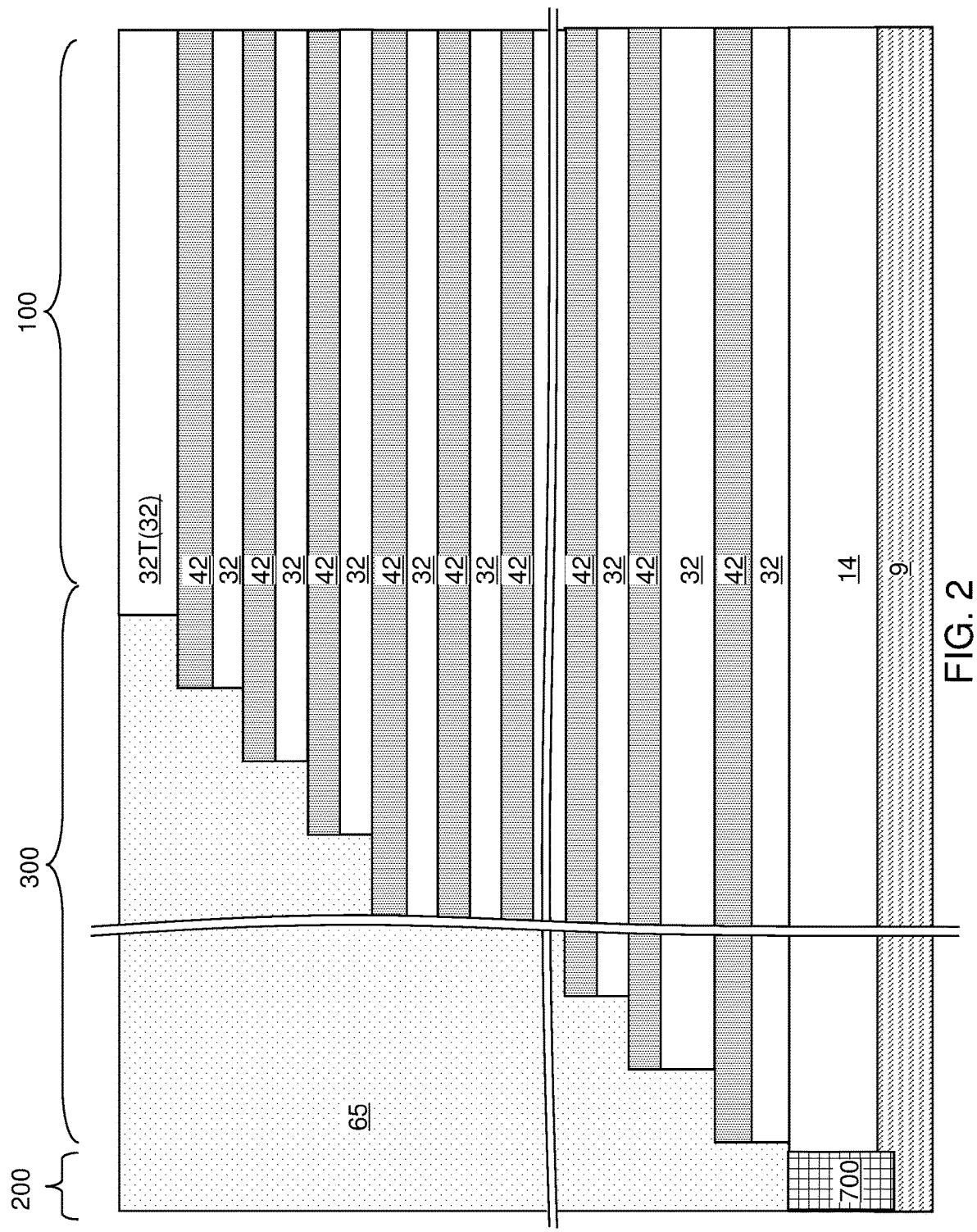
FIG. 2 is a schematic vertical cross-sectional view of the exemplary structure after formation of stepped terraces and a retro-stepped dielectric material portion according to an embodiment of the present disclosure.

Referring to FIG. 2, stepped surfaces are formed at a peripheral region of the alternating stack (32, 42), which is herein referred to as a terrace region. As used herein, "stepped surfaces" refer to a set of surfaces that include at least two horizontal surfaces and at least two vertical surfaces such that each horizontal surface is adjoined to a first vertical surface that extends upward from a first edge of the horizontal surface, and is adjoined to a second vertical surface that extends downward from a second edge of the horizontal surface. A stepped cavity is formed within the volume from which portions of the alternating stack (32, 42) are removed through formation of the stepped surfaces. A "stepped cavity" refers to a cavity having stepped surfaces.

The terrace region is formed in the staircase region 300, which is located between the memory array region 100 and the peripheral device region 200 containing the at least one semiconductor device for the peripheral circuitry. The stepped cavity can have various stepped surfaces such that the horizontal cross-sectional shape of the stepped cavity changes in steps as a function of the vertical distance from the top surface of the substrate 9. In one embodiment, the stepped cavity can be formed by repetitively performing a set of processing steps. The set of processing steps can include, for example, an etch process of a first type that vertically increases the depth of a cavity by one or more levels, and an etch process of a second type that laterally expands the area to be vertically etched in a subsequent etch process of the first type. As used herein, a "level" of a structure including alternating plurality is defined as the relative position of a pair of a first material layer and a second material layer within the structure.

Each sacrificial material layer 42 other than a topmost sacrificial material layer 42 within the alternating stack (32, 42) laterally extends farther than any overlying sacrificial material layer 42 within the alternating stack (32, 42) in the terrace region. The terrace region includes stepped surfaces of the alternating stack (32, 42) that continuously extend from a bottommost layer within the alternating stack (32, 42) to a topmost layer within the alternating stack (32, 42).

Each vertical step of the stepped surfaces can have the height of one or more pairs of an insulating layer 32 and a sacrificial material layer. In one embodiment, each vertical step can have the height of a single pair of an insulating layer 32 and a sacrificial material layer 42. In another embodiment, multiple "columns" of staircases can be formed along a first horizontal direction such that each vertical step has the height of a plurality of pairs of an insulating layer 32 and a sacrificial material layer 42, and the number of columns can be at least the number of the plurality of pairs. Each column of staircase can be vertically offset from each other such that each of the sacrificial material layers 42 has a physically exposed top surface in a respective column of staircases. In the illustrative example, two columns of staircases are formed for each block of memory stack structures to be subsequently formed such that one column of staircases provides physically exposed top surfaces for odd-numbered sacrificial material layers 42 (as counted from the bottom) and another column of staircases provides physically exposed top surfaces for even-numbered sacrificial material layers (as counted from the bottom). Configurations employing three, four, or more columns of staircases with a respective set of vertical offsets among the physically exposed surfaces of the sacrificial material layers 42 may also be employed. Each sacrificial material layer 42 has a greater lateral extent, at least along one direction, than any overlying sacrificial material layers 42 such that each physically exposed surface of any sacrificial material layer 42 does not have an overhang. In one embodiment, the vertical steps within each column of staircases may be arranged along the first horizontal direction, and the columns of staircases may be arranged along a second horizontal direction that is perpendicular to the first horizontal direction. In one embodiment, the first horizontal direction may be perpendicular to the boundary between the memory array region 100 and the staircase region 300.

A retro-stepped dielectric material portion 65 (i.e., an insulating fill material portion) can be formed in the stepped cavity by deposition of a dielectric material therein. For example, a dielectric material such as silicon oxide can be deposited in the stepped cavity. Excess portions of the deposited dielectric material can be removed from above the top surface of the topmost insulating layer 32T, for example, by chemical mechanical planarization (CMP). The remaining portion of the deposited dielectric material filling the stepped cavity constitutes the retro-stepped dielectric material portion 65. As used herein, a "retro-stepped" element refers to an element that has stepped surfaces and a horizontal cross-sectional area that increases monotonically as a function of a vertical distance from a top surface of a substrate on which the element is present. If silicon oxide is employed for the retro-stepped dielectric material portion 65, the silicon oxide of the retro-stepped dielectric material portion 65 may, or may not, be doped with dopants such as B, P, and/or F.

Figure 3A:
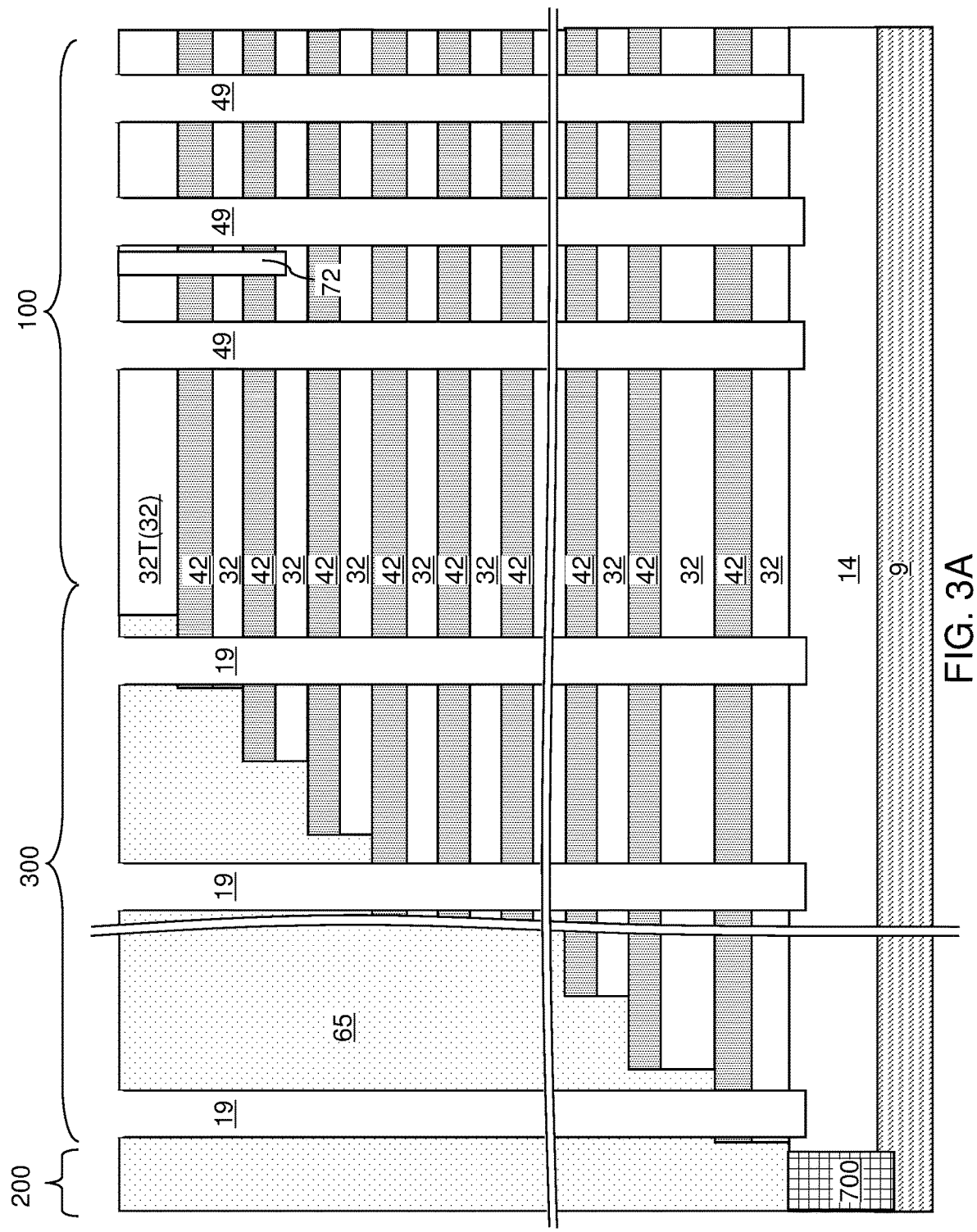
FIG. 3A is a schematic vertical cross-sectional view of the exemplary structure after formation of memory openings and support openings according to an embodiment of the present disclosure.
Figure 3B:
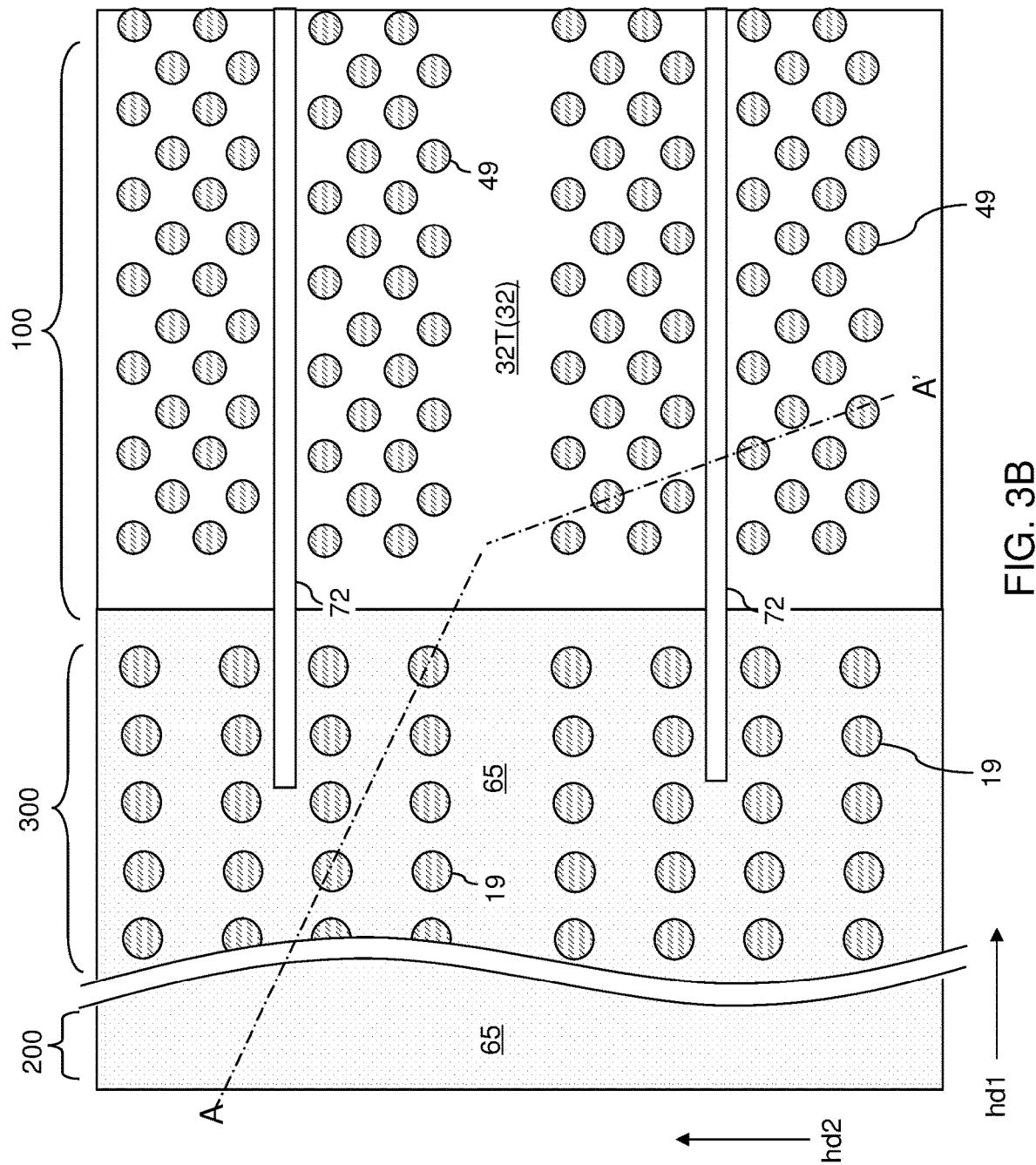
FIG. 3B is a top-down view of the exemplary structure of FIG. 3A. The vertical plane A-A' is the plane of the cross-section for FIG. 3A.

Referring to FIGS. 3A and 3B, a lithographic material stack (not shown) including at least a photoresist layer can be formed over the topmost insulating layer 32T and the retro-stepped dielectric material portion 65, and can be lithographically patterned to form openings therein. The openings include a first set of openings formed over the memory array region 100 and a second set of openings formed over the staircase region 300. The pattern in the lithographic material stack can be transferred through the topmost insulating layer 32T or the retro-stepped dielectric material portion 65, and through the alternating stack (32, 42) by at least one anisotropic etch that employs the patterned lithographic material stack as an etch mask. Portions of the alternating stack (32, 42) underlying the openings in the patterned lithographic material stack are etched to form memory openings 49 and support openings 19. As used herein, a "memory opening" refers to a structure in which memory elements, such as a memory stack structure, is subsequently formed. As used herein, a "support opening" refers to a structure in which a support structure (such as a support pillar structure) that mechanically supports other elements is subsequently formed. The memory openings 49 are formed through the topmost insulating layer 32T and the entirety of the alternating stack (32, 42) in the memory array region 100. The support openings 19 are formed through the retro-stepped dielectric material portion 65 and the portion of the alternating stack (32, 42) that underlie the stepped surfaces in the staircase region 300.

The memory openings 49 extend through the entirety of the alternating stack (32, 42). The support openings 19 extend through a subset of layers within the alternating stack (32, 42). The chemistry of the anisotropic etch process employed to etch through the materials of the alternating stack (32, 42) can alternate to optimize etching of the first and second materials in the alternating stack (32, 42). The anisotropic etch can be, for example, a series of reactive ion etches. The sidewalls of the memory openings 49 and the support openings 19 can be substantially vertical, or can be tapered. The patterned lithographic material stack can be subsequently removed, for example, by ashing.

The memory openings 49 and the support openings 19 can extend from the top surface of the alternating stack (32, 42) to at least the horizontal plane including the topmost surface of the semiconductor layer 14. In one embodiment, an overetch into the semiconductor layer 14 may be optionally performed after the top surface of the semiconductor layer 14 is physically exposed at a bottom of each memory opening 49 and each support opening 19. The overetch may be performed prior to, or after, removal of the lithographic material stack. In other words, the recessed surfaces of the semiconductor layer 14 may be vertically offset from the un-recessed top surfaces of the semiconductor layer 14 by a recess depth. The recess depth can be, for example, in a range from 1 nm to 50 nm, although lesser and greater recess depths can also be employed. The overetch is optional, and may be omitted. If the overetch is not performed, the bottom surfaces of the memory openings 49 and the support openings 19 can be coplanar with the topmost surface of the semiconductor layer 14.

Each of the memory openings 49 and the support openings 19 may include a sidewall (or a plurality of sidewalls) that extends substantially perpendicular to the topmost surface of the substrate. A two-dimensional array of memory openings 49 can be formed in the memory array region 100. A two-dimensional array of support openings 19 can be formed in the staircase region 300.

FIGS. 4A-4J illustrate structural changes in a memory opening 49, which is one of the memory openings 49 in the exemplary structure of FIGS. 3A and 3B. The same structural change occurs simultaneously in each of the other memory openings 49 and in each of the support openings 19.

Referring to FIG. 4A, a memory opening 49 in the exemplary device structure of FIGS. 3A and 3B is illustrated. The memory opening 49 extends through the topmost insulating layer 32T, the alternating stack (32, 42), and optionally into an upper portion of the semiconductor layer 14. At this processing step, each support opening 19 can extend through the retro-stepped dielectric material portion 65, a subset of layers in the alternating stack (32, 42), and optionally through the upper portion of the semiconductor layer 14. The recess depth of the bottom surface of each memory opening 49 with respect to the top surface of the semiconductor layer 14 can be in a range from 0 nm to 30 nm, although greater recess depths can also be employed.

Referring to FIG. 4B, an isotropic etch process can be performed to laterally recess physically exposed tubular sidewalls of the sacrificial material layers 42 selective to the material of the insulating layer 32. For example, if the sacrificial material layers 42 include silicon nitride, and if the insulating layers 32 include a doped silicate glass or organosilicate glass, a wet etch process employing hot phosphoric acid can be employed to laterally recess the physically exposed sidewalls of the sacrificial material layers 42 selective to the insulating layers 32. Lateral recesses 49R can be formed at levels of the sacrificial material layers 42 around each memory opening 49. Generally, the lateral recesses 49R can be formed by laterally recessing sidewalls of the sacrificial material layers 42 around the memory opening 49. The lateral recess distance of the sidewalls of the sacrificial material layers 42 can be in a range from 12 nm to 60 nm, although lesser and greater distances can also be employed.

Figure 4D:
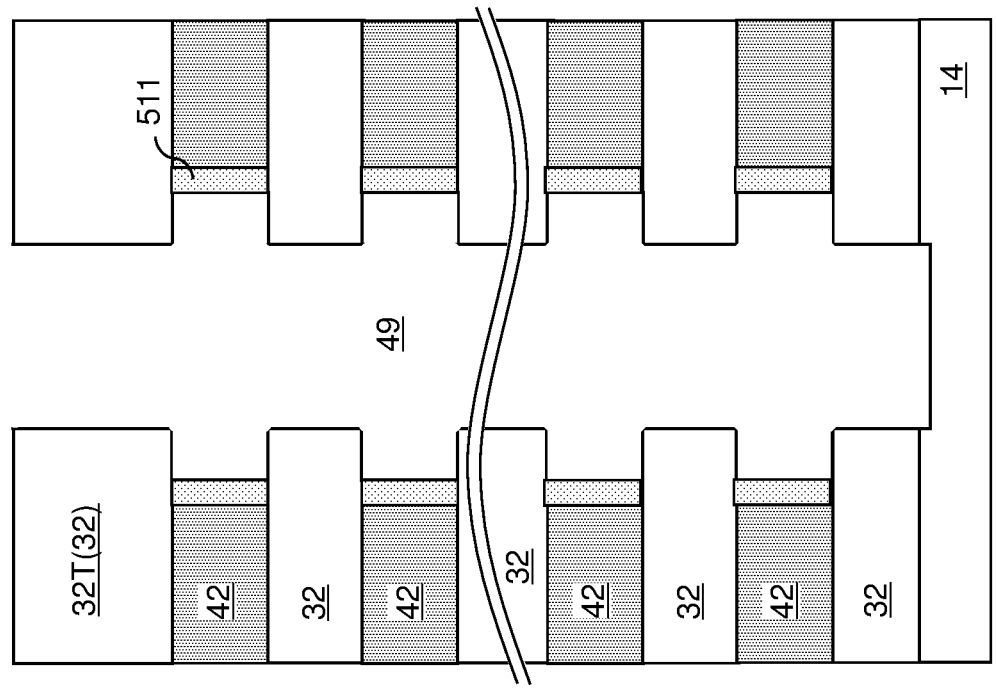
Figure 4C:
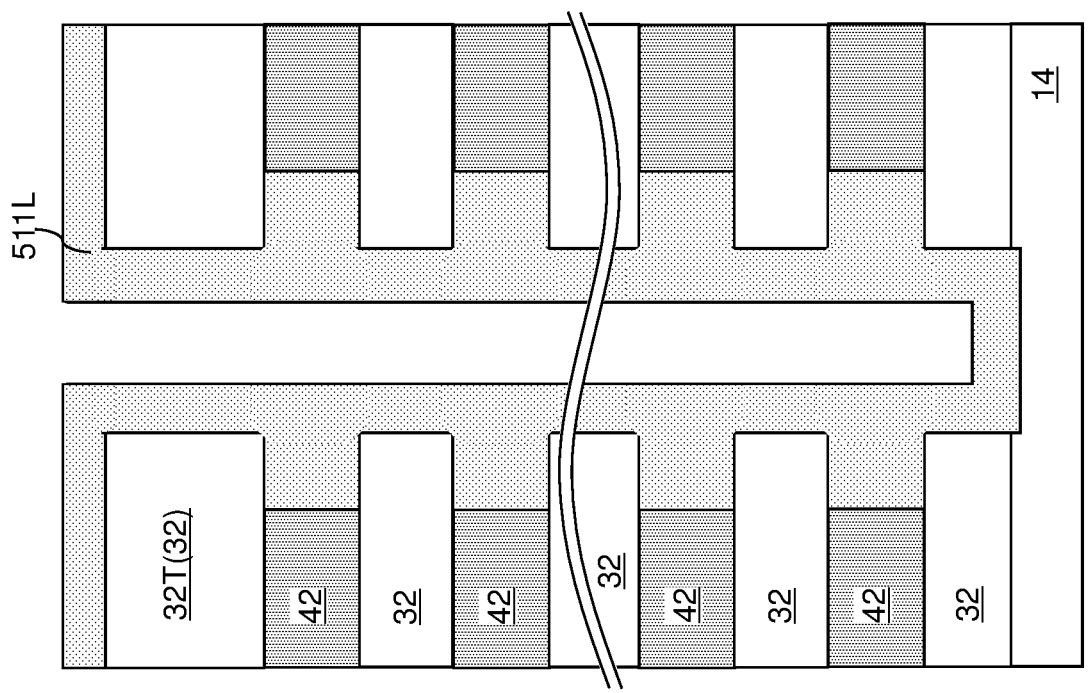

Referring to FIG. 4C, a first template material layer 511L can be conformally deposited in peripheral portions of each memory opening 49 that include a respective set of lateral recesses 49R. The first template material layer 511L includes a first template material, which may be an amorphous template material that may be subsequently crystallized to provide crystalline templates for nucleation of a crystalline material. In one embodiment, the first template material may include an amorphous material that can be subsequently crystallized to provide a textured polycrystalline or single crystalline material having a predominant crystallographic orientation along surfaces that are parallel to local interfaces with the sacrificial material layers 42 (such as sidewalls of the sacrificial material layers 42). In one embodiment, the first template material may include an amorphous material that can be subsequently crystallized to provide a polycrystalline or single crystalline template structure having a lattice constant that is lattice matched to a lattice constant of hafnium zirconium oxide. In one embodiment, the first template material may include amorphous yttria stabilized zirconia ("YSZ"). In one embodiment, the ratio of yttrium oxide to zirconium oxide in the YSZ can be selected such that the lattice constant of the YSZ is lattice matched to hafnium zirconium oxide or any other ferroelectric dielectric material to be subsequently employed to form ferroelectric memory elements. For example, the YSZ may comprise 3 to 11 molar percent yttria and remainder zirconia. The thickness of the first template material layer 511L can be selected such that each lateral recess 49R is at least partially filled with the first template material.

Referring to FIG. 4D, at least one etch process can be performed to remove portions of the first template material layer 511L located outside the volumes of the lateral recesses 49R. The at least one etch process may include an isotropic etch process and/or an anisotropic etch process. In one embodiment, the at least one etch process may include an isotropic etch step that laterally recesses portions of the first template material from a cylindrical sidewall including sidewalls of the insulating layers 32 around each memory opening 49. In this case, remaining annular portions of the first template material layer 511L may have a lateral thickness that is less than the lateral recess distance of the lateral recesses 49R. Each remaining discrete annular portion of the first template material layer 511L is herein referred to as an amorphous cylindrical template material portion 511. Generally, the amorphous cylindrical template material portions 511 can be formed by conformally depositing an first template material layer 511L in the lateral recesses 49R and a peripheral portion of each memory opening 49, and by recessing the material of the first template material layer 511L so that discrete portions of the first template material layer 511L remain in the lateral recesses 49R. Each amorphous cylindrical template material portion 511 can have a lateral thickness (as measured between an inner cylindrical sidewall and an outer cylindrical sidewall) in a range from 3 nm to 20 nm, such as from 5 nm to 10 nm, although lesser and greater thicknesses may also be employed.

Figure 4F:
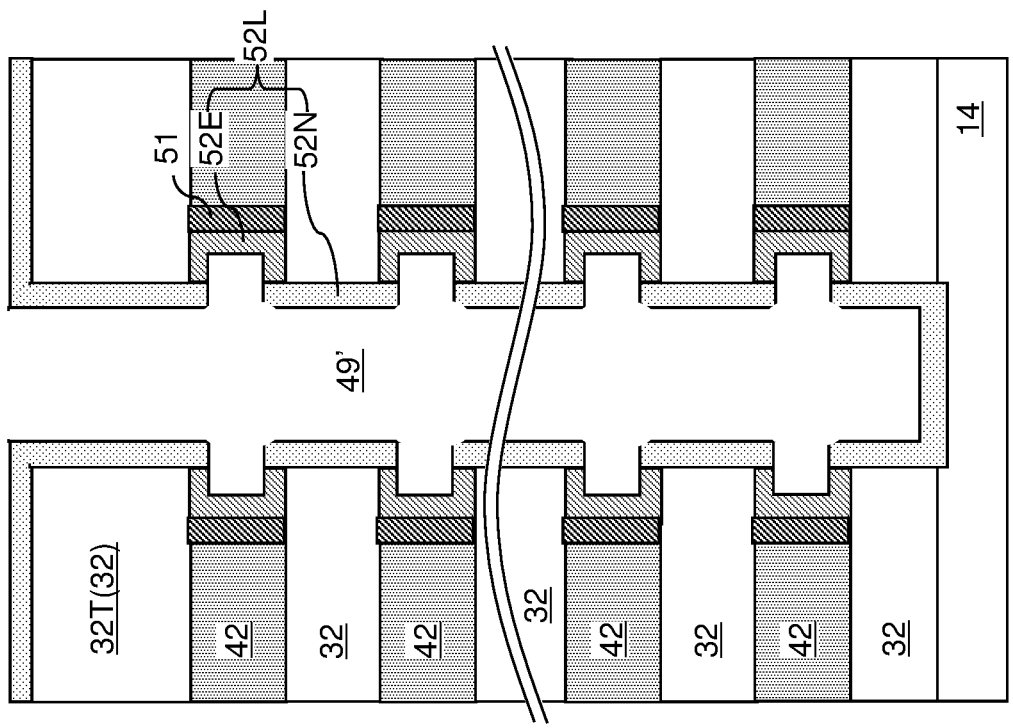
Figure 4E:
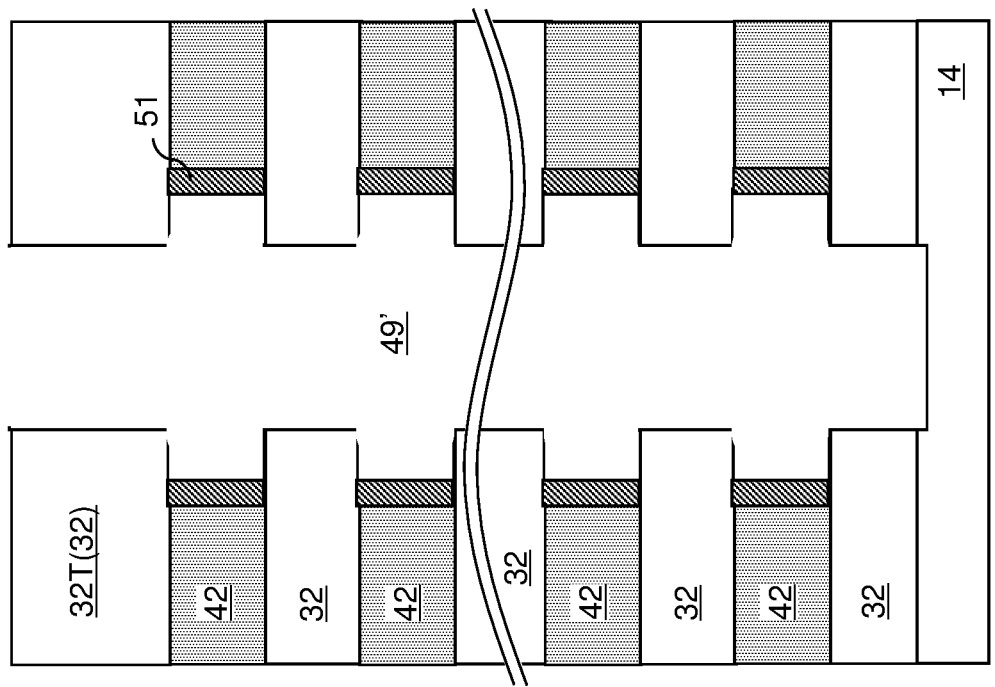

Referring to FIG. 4E, an anneal process can be performed to crystallize the amorphous cylindrical template material portions 511, which are converted into crystalline template structures 51. The crystalline template structures 51 may be highly textured YSZ templates. The crystalline template structures 51 may comprise single crystalline or large grain polycrystalline YSZ. Thus, the crystalline template structures 51 can have a preferred crystallographic orientation (e.g., (111), (110) or (220)) along radial directions, i.e., along directions that are perpendicular to a local interface with the sacrificial material layers 42. Therefore, the crystalline template structures 51 provide a preferred crystallographic orientation on their physically exposed inner cylindrical surfaces for subsequent nucleation of a ferroelectric material with a preferential grow direction. A memory cavity 49' is present in a volume of a memory opening 49 that is not filled with a vertical stack of crystalline template structures 51.

Referring to FIG. 4F, a second template material can be conformally deposited to form a second template material layer 52L. The second template material layer 52L includes epitaxial template portions 52E that are epitaxially aligned to the crystalline structures of the crystalline template structures 51, and non-epitaxial template portions 52N that contact surfaces of the insulating layers 32 or the semiconductor layer 14, do not contact the crystalline template structures 51, and are either amorphous or polycrystalline with random crystallographic orientations. Generally, an epitaxial template portion 52E can be formed on an inner cylindrical sidewall of each of the crystalline template structures 51. In one embodiment, each epitaxial template portion 52E may be a single crystalline or large grain, highly textured polycrystalline template portion.

Generally, the epitaxial template portions 52E comprise, and/or consist essentially of, a material that can be grown with epitaxial alignment with the crystallographic surfaces of the crystalline template structures 51. In one embodiment, the crystalline template structures 51 may include yttria stabilized zirconia, and the epitaxial template portions 52E can comprise, and/or can consist essentially of, a material selected from an electrically conductive metal oxide, such as indium tin oxide or lead iridium oxide, or a titanium nitride/titanium oxide bilayer. If the epitaxial template portions 52E comprises a titanium nitride/titanium oxide bilayer, then the epitaxial template portions 52E may initially comprise titanium nitride, followed by formation of a titanium dioxide interfacial layer during formation of a doped hafnium oxide ferroelectric material on the titanium nitride. Generally, each of the epitaxial template portions 52E can be formed in epitaxial alignment with a respective one of the crystalline template structures 51.

Figure 4H:
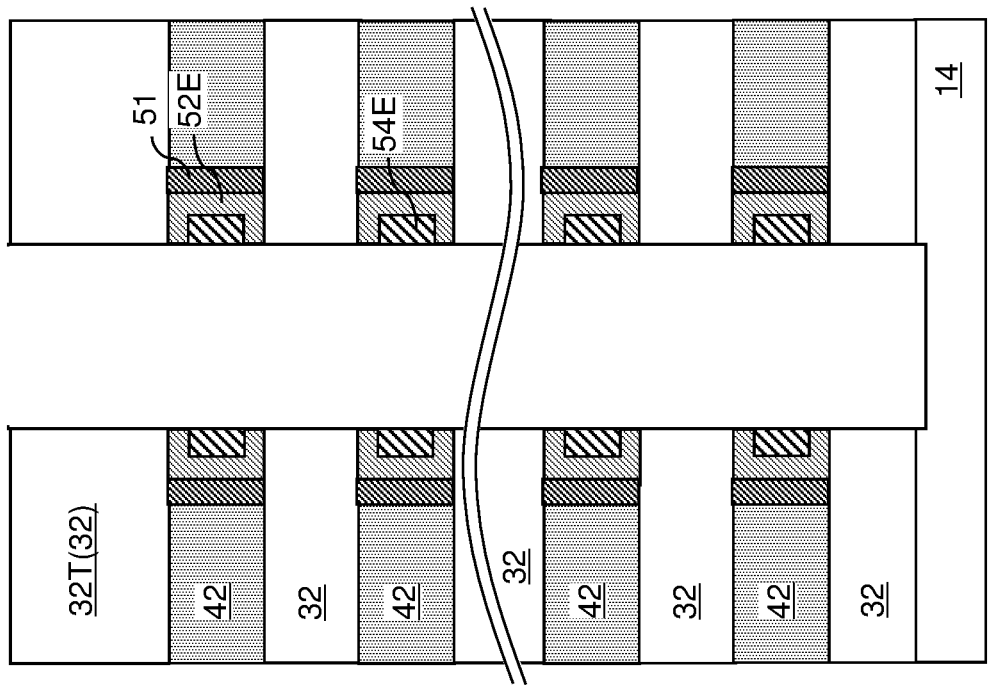
Figure 4G:
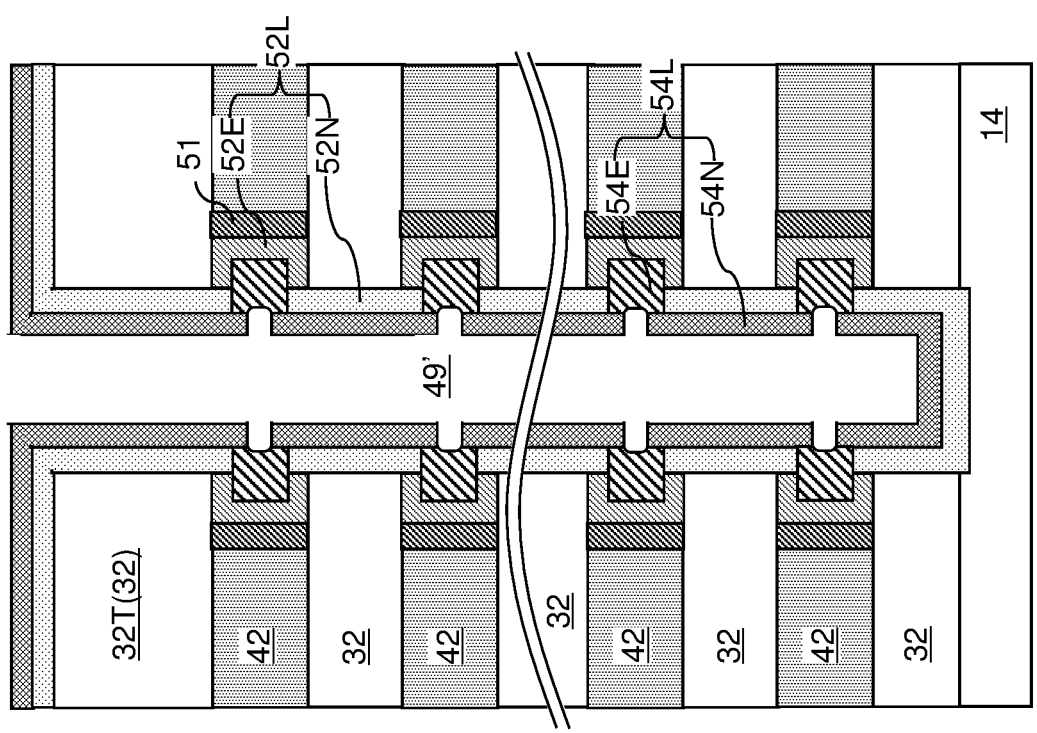

Referring to FIG. 4G, a dielectric material layer 54L including a dielectric material having a ferroelectric phase and at least one non-ferroelectric phase can be conformally deposited within each of the lateral recesses 49R. The process temperature for deposition of the dielectric material layer 54L is selected such that portions of the dielectric material that are formed directly on surfaces of the epitaxial template portions 52E are deposited in a ferroelectric crystalline phase in epitaxial alignment with a respective one of the epitaxial template portions 52E. Such ferroelectric crystalline phase material portions are subsequently employed as memory material portions, and are herein referred to as crystalline ferroelectric memory material portions 54E. Generally, a crystalline ferroelectric memory material portion 54E can be formed on each of the epitaxial template portions 52E. Each of the crystalline ferroelectric memory material portions 54E is epitaxially aligned to crystallographic grains of a respective one of the epitaxial template portions 52E. Each of the crystalline ferroelectric memory material portions 54E can be single crystalline or polycrystalline with a preferred (e.g., textured) grain orientation.

The dielectric material layer 54L can also include portions that are formed on surfaces of the insulating layers 32 or the semiconductor layer 14. The portions of the dielectric material layer 54L that are formed on the surfaces of the insulating layers 32 or the semiconductor layer 14 are herein referred to as dielectric material portions 54N. The dielectric material portions 54N have a same material composition as the crystalline ferroelectric memory material portions 54E. A vertical stack of dielectric material portions 54N can be vertically interlaced with a vertical stack of crystalline ferroelectric memory material portions 54E. In one embodiment, the vertical stack of dielectric material portions 54N may be not ferroelectric, and may be either amorphous or may be polycrystalline with random crystallographic grain orientations (i.e., lacking texture/preferred grain orientation). In one embodiment, the crystalline ferroelectric memory material portions 54E comprise, and/or consist essentially of, a doped hafnium oxide, such as zirconium doped hafnium oxide (i.e., hafnium zirconium oxide), silicon doped hafnium oxide, or aluminum doped hafnium oxide.

In one embodiment, each crystalline ferroelectric memory material portion 54E can be polycrystalline, and each grain in a crystalline ferroelectric memory material portion 54E can be epitaxially aligned to a respective grain in the crystallographic grains of an epitaxial template portion 52E. In another embodiment, the crystalline ferroelectric memory material portion 54E may be single crystalline.

In one embodiment, each of the crystalline ferroelectric memory material portions 54E may be vertically spaced from an overlying one of the insulating layers 32 and an underlying one of the insulating layers 32 by horizontally-extending portions of the epitaxial template portions 52E. In one embodiment, the dielectric material layer 54L comprises, and/or consists essentially of, hafnium zirconium oxide having a lattice constant that is matched with the lattice constant of the crystalline material of the epitaxial template portion 52E within 5%, such as within 3% and/or within 1%.

Referring to FIG. 4H, portions of the dielectric material layer 54L and the second template material layer 52L that are located outside the lateral recesses 49R can be removed, for example, by an anisotropic etch process. Generally, portions of the dielectric material layer 54L and the second template material layer 52L can be anisotropically etched from outside the lateral recesses 49R by performing the anisotropic etch process. Remaining portions of the dielectric material layer 54L in the lateral recesses 49R comprise the crystalline ferroelectric memory material portions 54E. Remaining portions of the second template material layer 52L in the lateral recesses 49R comprise the epitaxial template portions 52E. The dielectric material portions 54N and the non-epitaxial template portions 52N can be removed by the anisotropic etch process. In general, crystalline hafnium zirconium oxide portions 54E have a higher etch resistance than amorphous hafnium zirconium oxide portions 54N to typical hafnium zirconium oxide etchants (e.g., HF and $TiCl_4$ at 250 degrees Celsius using atomic layer etching), and are not significantly etched during the anisotropic etch.

Each epitaxial template portion 52E may have a clam-shaped vertical cross-sectional profile. In this case, each epitaxial template portion 52E may include a top annular portion, a bottom annular portion, and a cylindrical portion vertically connecting the top annular portion and the bottom annular portion and having a lesser horizontal cross-sectional area than the top annular portion or the bottom annular portion. A top periphery of an outer cylindrical sidewall of an epitaxial template portion 52E can be adjoined to an outer periphery of a top surface of the top annular portion of the epitaxial template portion 52E, and a bottom periphery of the outer cylindrical sidewall of the epitaxial template portion 52E can be adjoined to an outer periphery of a bottom surface of the bottom annular portion of the epitaxial template portion 52E. In one embodiment, each crystalline ferroelectric memory material portion 54E can have a cylindrical shape, and each crystalline ferroelectric memory material portion 54E can have a radial dipole moment that is parallel to, or is antiparallel to, a radial direction extending radially and horizontally from a vertical axis passing through a geometrical center of a memory opening 49.

In one embodiment, a cylindrical sidewall of a top annular portion of an epitaxial template portion 52E, a cylindrical sidewall of a bottom annular portion of the epitaxial template portion 52E, and an inner cylindrical sidewall of a crystalline ferroelectric memory material portion 54E that is embedded within the epitaxial template portion 52E can be vertically coincident, i.e., can be located within a same vertical plane. In one embodiment, the inner cylindrical sidewall of each crystalline ferroelectric memory material portion 54E can be vertically coincident with sidewalls of insulating layers 32 around a same memory opening 49.

Each crystalline template structure 51 and each epitaxial template portion 52E can have a lateral thickness (as measured between an inner cylindrical sidewall and an outer cylindrical sidewall) in a range from 3 nm to 20 nm, such as from 5 nm to 10 nm, although lesser and greater thicknesses may also be employed. Each crystalline ferroelectric memory material portion 54E can have a lateral thickness in a range from 5 nm to 25 nm, such as from 7 nm to 15 nm, although lesser and greater thicknesses may also be employed Each contiguous combination of a crystalline template structure 51, an epitaxial template portion 52E, and a crystalline ferroelectric memory material portion 54E constitutes a memory element (51, 52E, 54E). Since the layer 54E is electrically isolated between adjacent cells, the interference between neighboring word lines is minimized. A vertical stack of memory elements (51, 52E, 54E) can be formed within each memory opening 49. Each memory element (51, 52E, 54E) comprises a crystalline ferroelectric memory material portion 54E, which stores data in the form of a configuration of a non-zero dipole moment. For example, the non-zero dipole moment of each crystalline ferroelectric memory material portion 54E may point radially inward upon programming, or may point radially outward upon programming.

In one embodiment, each memory element (51, 52E, 54E) within a vertical stack of memory elements (51, 52E, 54E) comprises a crystalline template structure 51 contacting an outer cylindrical sidewall of an epitaxial template portion 52E. The crystallographic grain(s) of the epitaxial template portion 52E are epitaxially aligned to polycrystalline grain(s) within the crystalline template structure 51. In one embodiment, an outer sidewall of each crystalline template structure 51 contacts a cylindrical sidewall of a respective one of the sacrificial material layers 42.

Figure 4J:
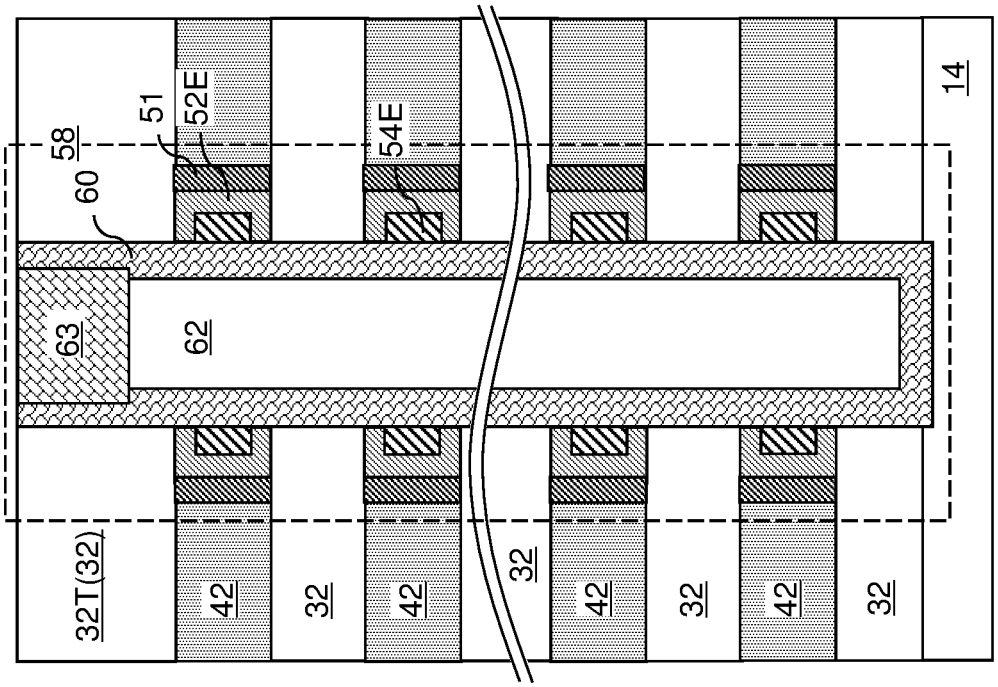
Figure 4I:
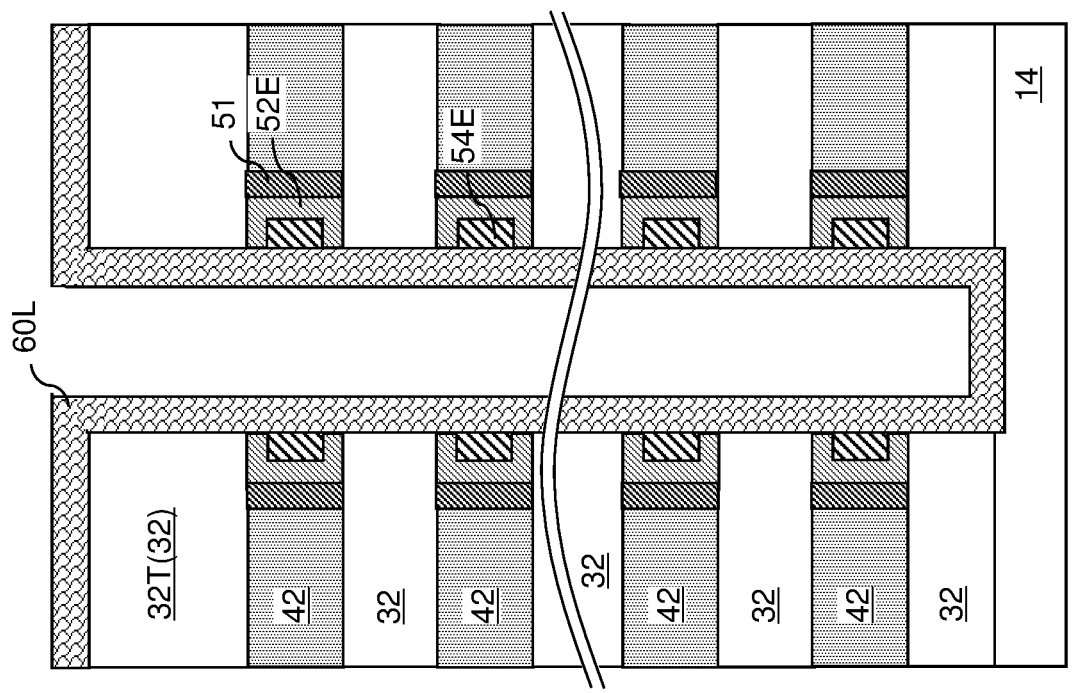

Referring to FIG. 4I, a doped semiconductor material can be conformally deposited within the memory openings 49 to form a semiconductor channel layer 60L. The semiconductor channel layer 60L can include a polycrystalline semiconductor material, or an amorphous semiconductor material that can be subsequently converted into a polycrystalline semiconductor material by an anneal process. The semiconductor channel layer 60L may include doped silicon, a doped silicon-germanium alloy, a doped III-V compound semiconductor material, a doped II-V compound semiconductor material, a doped metal-oxide semiconductor material, or a doped organic semiconductor material. The thickness of the semiconductor channel layer 60L may be in a range from 5 nm to 50 nm, such as from 10 nm to 25 nm, although lesser and greater thicknesses may also be employed. The semiconductor channel layer 60L may be p-doped or n-doped. The atomic concentration of electrical dopants within the semiconductor channel layer 60L may be in a range from $1.0\times10^{14}/cm^3$ to $1.0\times10^{17}/cm^3$, although lesser and greater atomic concentrations may also be employed.

Referring to FIG. 4J, a dielectric fill material such as silicon oxide can be deposited in remaining unfilled volumes of the memory openings 49. Excess portions of the dielectric fill material and the semiconductor channel layer 60L can be removed from above a horizontal plane including the top surface of the topmost insulating layer 32T by a planarization process. The planarization process can employ a recess etch and/or a chemical mechanical polishing (CMP) process. Each remaining portion of the semiconductor channel layer 60L constitutes a vertical semiconductor channel 60, which can function as vertical bit lines for a three-dimensional ferroelectric memory device. Each remaining portion of the dielectric fill material constitutes a dielectric core 62.

A semiconductor drain region 63 is then formed in contact with the upper part of the vertical semiconductor channel 60. The semiconductor drain region 63 is doped with electrical dopants of the second conductivity type (e.g., n-type) that is opposite to the first conductivity type dopants in the vertical semiconductor channel 60. The semiconductor drain region 63 may be formed by depositing a doped semiconductor material (e.g., polysilicon) in the recess above the dielectric core 62 and/or by implanting dopants of the second conductivity type into the upper part of the vertical semiconductor channel 60 and/or into the semiconductor material deposited in the recess above the dielectric core 62. The atomic concentration of electrical dopants of the second conductivity type within the semiconductor drain region 63 may be in a range from $1.0\times10^{18}/cm^3$ to $1.0\times10^{20}/cm^3$, although lesser and greater atomic concentrations may also be employed.

The set of all material portions that fill a memory opening 49 constitutes a memory opening fill structure 58. Each memory opening fill structure 58 can include a vertical semiconductor channel 60, a semiconductor drain region 63 and a vertical stack of memory elements (51, 52E, 54E). Each memory element (51, 52E, 54E) within the vertical stack of memory elements (51, 52E, 54E) comprises a crystalline ferroelectric memory material portion 54E and an epitaxial template portion 52E. The crystalline ferroelectric memory material portion 54E is epitaxially aligned to crystallographic grains of the epitaxial template portion 52E. In one embodiment, the crystalline template structure 51 comprises, and/or consists essentially of, yttria stabilized zirconia. In one embodiment, the crystalline ferroelectric memory material portion 54E has an annular cylindrical shape. An inner cylindrical sidewall of the crystalline ferroelectric memory material portion 54E contacts the vertical semiconductor channel 60.

Support pillar structures are formed in the support openings 19 concurrently with formation of memory opening fill structures 58 in the memory openings 49 during the processing steps of FIGS. 4A-4J.

Figure 4K:
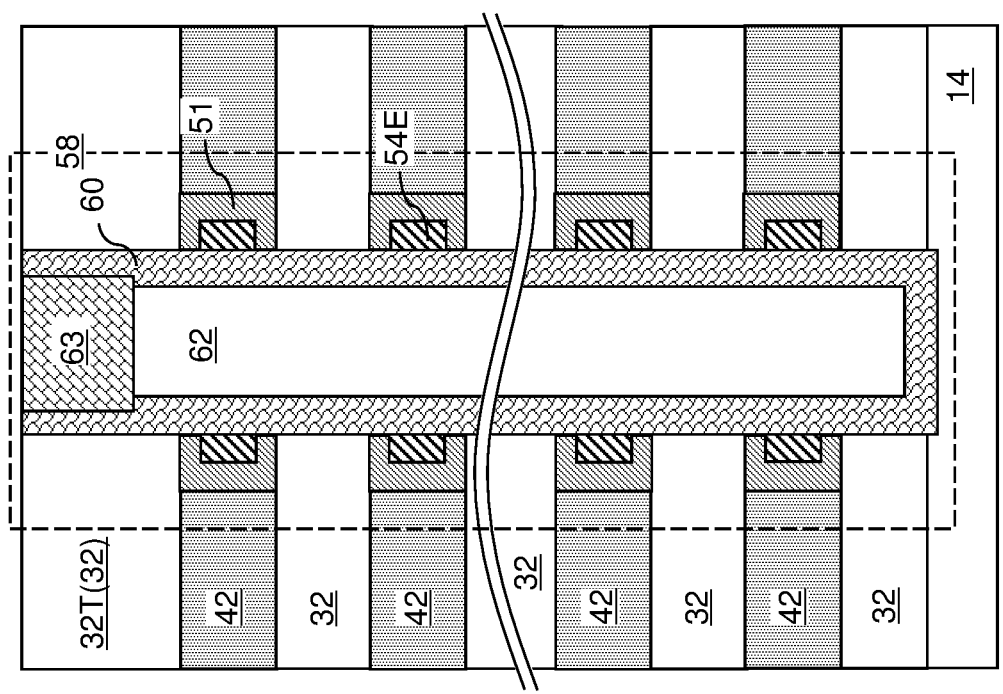
FIG. 4K is a vertical cross-sectional view of an alternative first configuration of the memory opening fill structure according to an alternative embodiment of the present disclosure.

FIG. 4K illustrates an alternative first configuration of the memory opening fill structure 58 according to an alternative embodiment of the present disclosure. In this alternative embodiment, the epitaxial template portion 52E of FIG. 4J is omitted and the crystalline ferroelectric memory material portion 54E is formed directly on and is epitaxially aligned to crystallographic grain(s) of the crystalline template structure 51. The crystalline template structure 51 may comprise and/or consist essentially of yttria stabilized zirconia. In this alternative embodiment, the crystalline template structure 51 may have a clam shape or a cylindrical shape described above.

Figure 5:
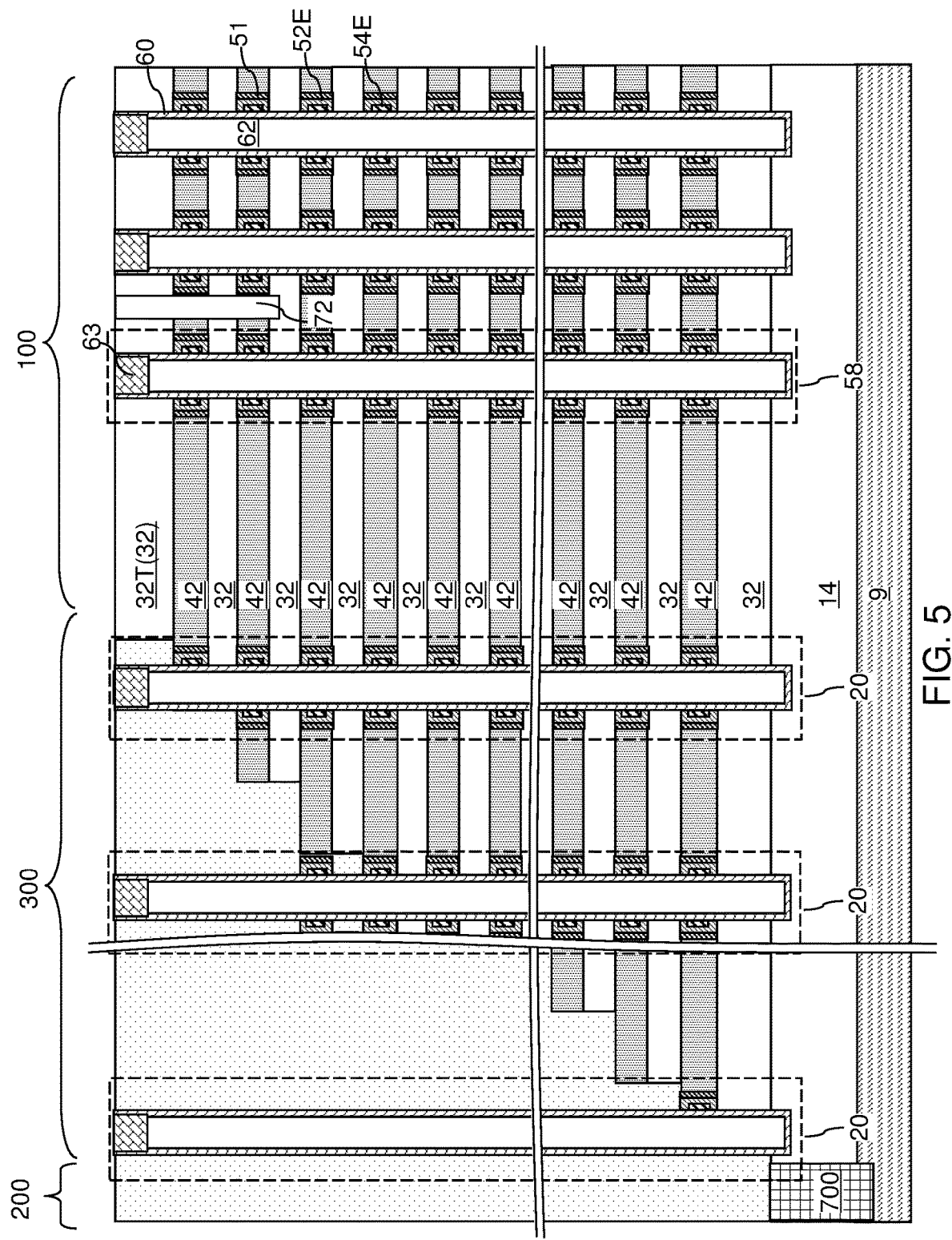
FIG. 5 is a schematic vertical cross-sectional view of the exemplary structure after formation of memory opening fill structures and support pillar structures according to an embodiment of the present disclosure.

Referring to FIG. 5, the exemplary structure is illustrated after formation of memory opening fill structures 58 and support pillar structure 20 within the memory openings 49 and the support openings 19, respectively. An instance of a memory opening fill structure 58 can be formed within each memory opening 49 of the structure of FIGS. 3A and 3B. An instance of the support pillar structure 20 can be formed within each support opening 19 of the structure of FIGS. 3A and 3B.

Figure 6A:
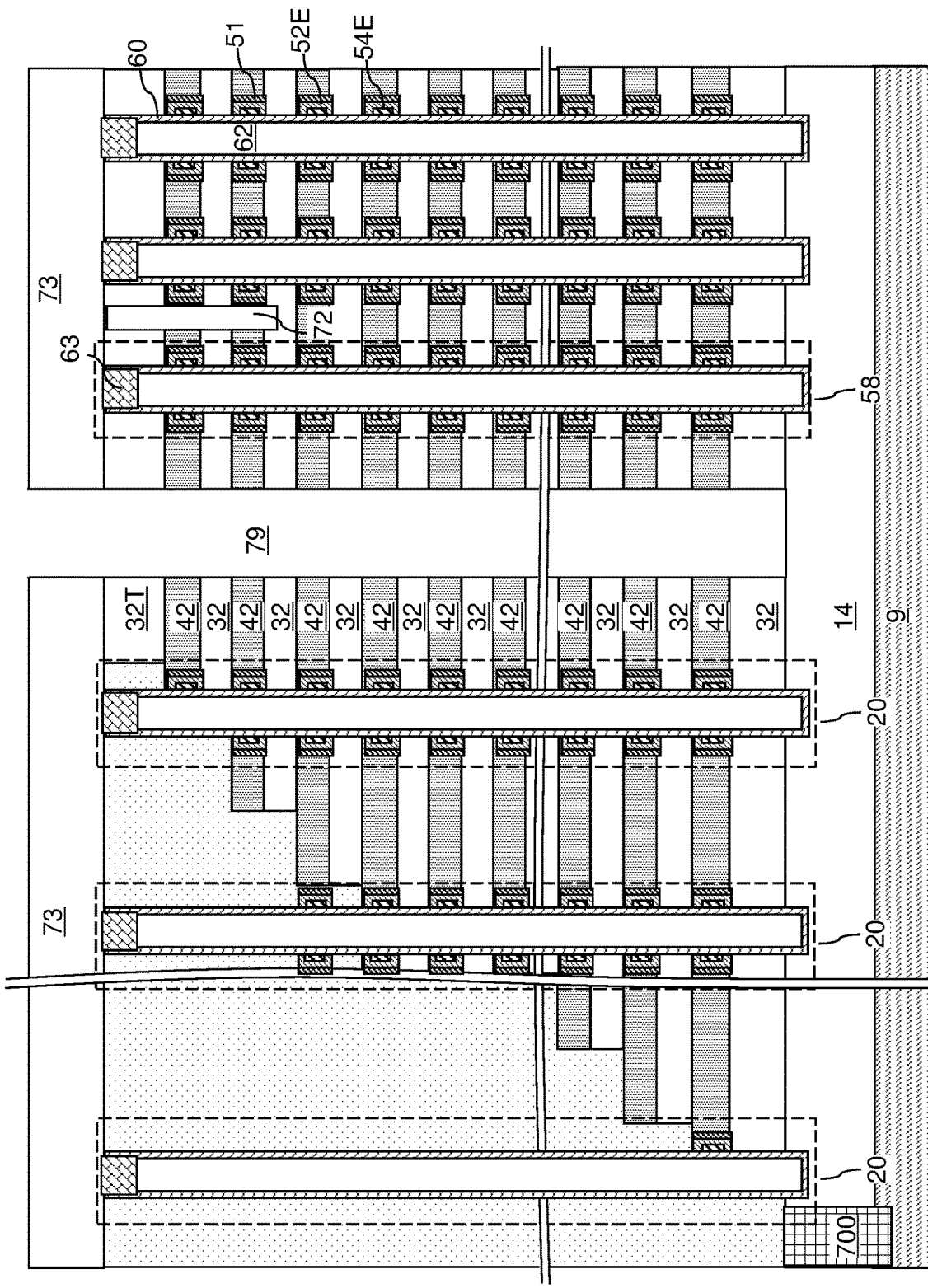
FIG. 6A is a schematic vertical cross-sectional view of the exemplary structure after formation of a contact-level dielectric layer and backside trenches according to an embodiment of the present disclosure.
Figure 6B:
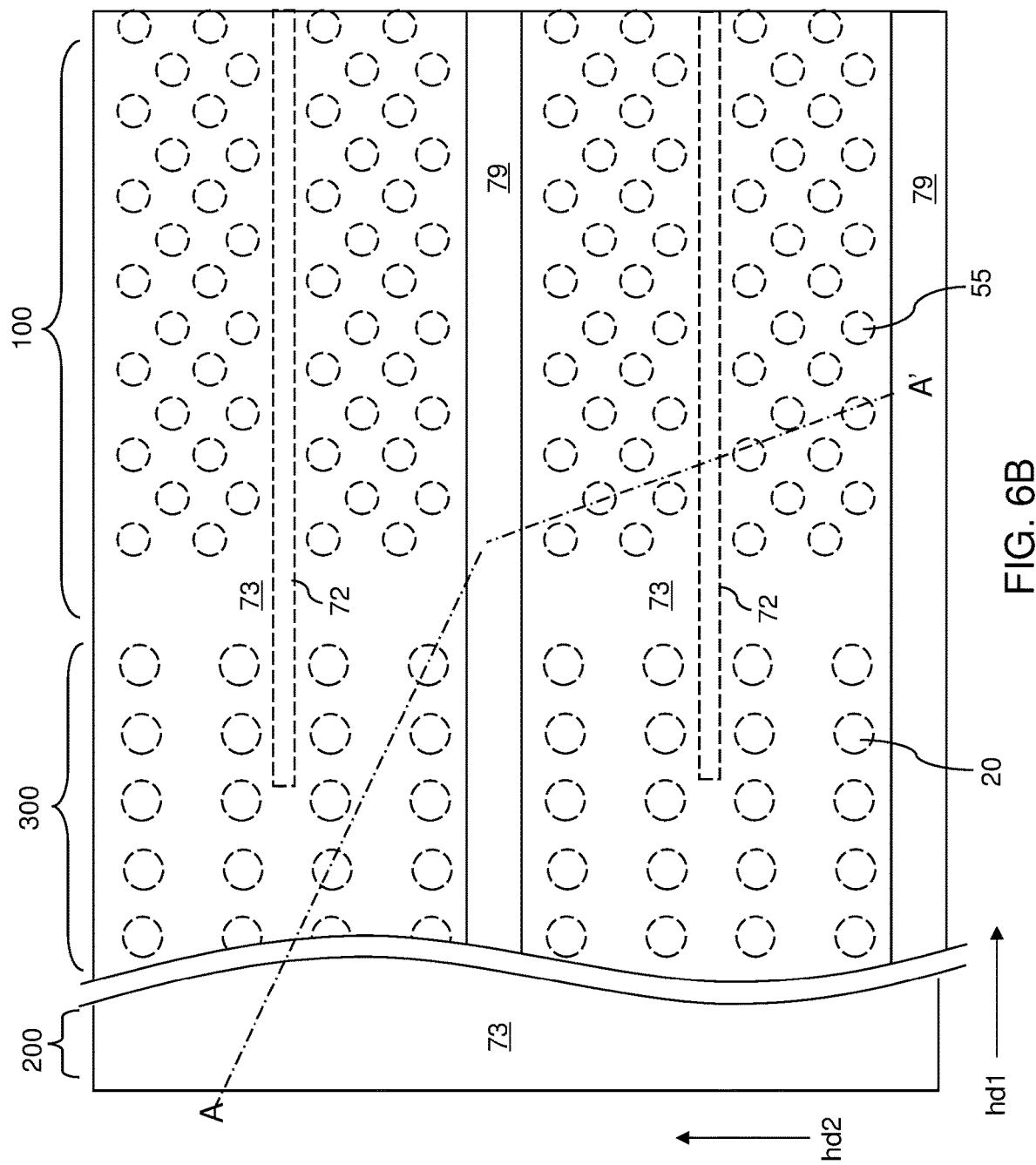
FIG. 6B is a partial see-through top-down view of the exemplary structure of FIG. 6A. The vertical plane A-A' is the plane of the schematic vertical cross-sectional view of FIG. 6A.

Referring to FIGS. 6A and 6B, a contact level dielectric layer 73 can be formed over the alternating stack (32, 42) of insulating layer 32 and sacrificial material layers 42, and over the memory opening fill structures 58 and the support pillar structures 20. The contact level dielectric layer 73 includes a dielectric material that is different from the dielectric material of the sacrificial material layers 42. For example, the contact level dielectric layer 73 can include silicon oxide. The contact level dielectric layer 73 can have a thickness in a range from 50 nm to 500 nm, although lesser and greater thicknesses can also be employed.

A photoresist layer (not shown) can be applied over the contact level dielectric layer 73, and is lithographically patterned to form openings in areas between clusters of memory opening fill structures 58. The pattern in the photoresist layer can be transferred through the contact level dielectric layer 73, the alternating stack (32, 42) and/or the retro-stepped dielectric material portion 65 employing an anisotropic etch to form backside trenches 79, which vertically extend from the top surface of the contact level dielectric layer 73 at least to the top surface of the substrate, and laterally extend through the memory array region 100 and the staircase region 300.

In one embodiment, the backside trenches 79 can laterally extend along a first horizontal direction (e.g., word line direction) hd1 and can be laterally spaced apart from each other along a second horizontal direction (e.g., bit line direction) hd2 that is perpendicular to the first horizontal direction hd1. The memory opening fill structures 58 can be arranged in rows that extend along the first horizontal direction hd1. Each backside trench 79 can have a uniform width that is invariant along the lengthwise direction (i.e., along the first horizontal direction hd1). Multiple rows of memory opening fill structures 58 can be located between a neighboring pairs of backside trenches 79. The photoresist layer can be removed, for example, by ashing.

Figure 7A:
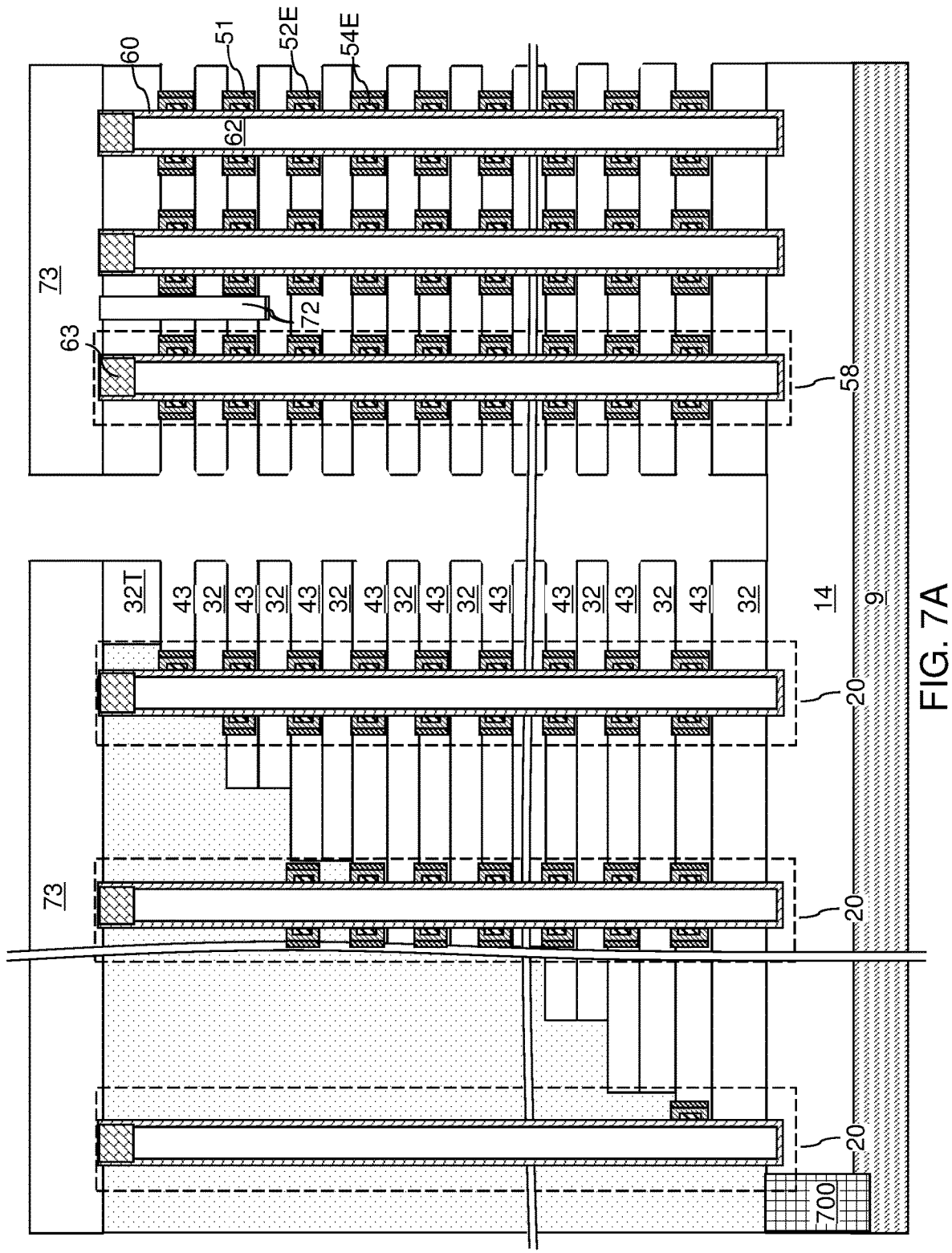
FIG. 7A is a schematic vertical cross-sectional view of the exemplary structure after formation of backside recesses according to an embodiment of the present disclosure.
Figure 7B:
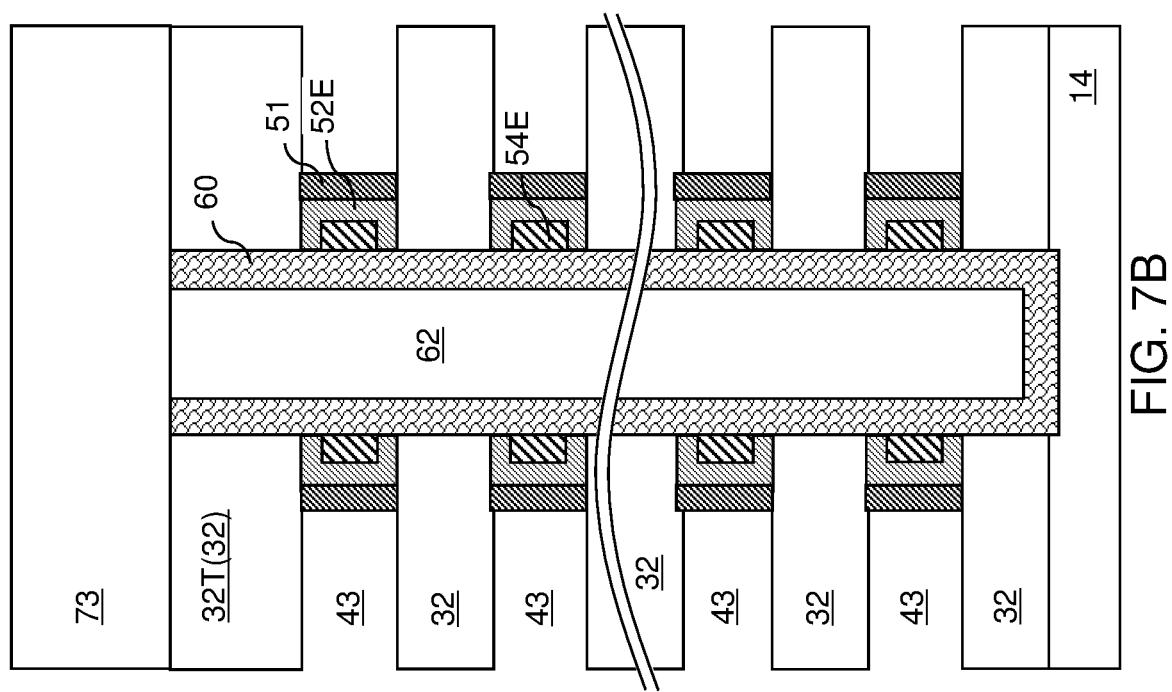
FIG. 7B is a magnified view of a portion of the exemplary structure of FIG. 7A around a memory opening fill structure.

Referring to FIGS. 7A and 7B, an etchant that selectively etches the second material of the sacrificial material layers 42 with respect to the first material of the insulating layers 32 can be introduced into the backside trenches 79, for example, by performing an etch process. Backside recesses 43 are formed in volumes from which the sacrificial material layers 42 are removed. The removal of the second material of the sacrificial material layers 42 can be selective to the first material of the insulating layers 32, the material of the retro-stepped dielectric material portion 65, the material of the semiconductor layer 14, and the material of the crystalline template structures 51. In one embodiment, the sacrificial material layers 42 can include silicon nitride, and the materials of the insulating layers 32 and the retro-stepped dielectric material portion 65 can be selected from silicon oxide and dielectric metal oxides.

The etch process that removes the sacrificial material layers 42 selective to the insulating layers 32 and the crystalline template structures 51 can be a wet etch process employing a wet etch solution, or can be a gas phase (dry) etch process in which the etchant is introduced in a vapor phase into the backside trenches 79. For example, if the sacrificial material layers 42 include silicon nitride, the etch process can be a wet etch process in which the exemplary structure is immersed within a wet etch tank including phosphoric acid, which etches silicon nitride selective to silicon oxide, silicon, and various other materials employed in the art. The support pillar structures 20, the retro-stepped dielectric material portion 65, and the memory opening fill structures 58 provide structural support while the backside recesses 43 are present within volumes previously occupied by the sacrificial material layers 42.

Each backside recess 43 can be a laterally extending cavity having a lateral dimension that is greater than the vertical extent of the cavity. In other words, the lateral dimension of each backside recess 43 can be greater than the height of the backside recess 43. A plurality of backside recesses 43 can be formed in the volumes from which the second material of the sacrificial material layers 42 is removed. The memory openings 49 in which the memory opening fill structures 58 are formed are herein referred to as front side openings in contrast with the backside recesses 43. Each of the plurality of backside recesses 43 can extend substantially parallel to the top surface of the substrate 9. A backside recess 43 can be vertically bounded by a top surface of an underlying insulating layer 32 and a bottom surface of an overlying insulating layer 32. In one embodiment, each backside recess 43 can have a uniform height throughout.

Figure 8:
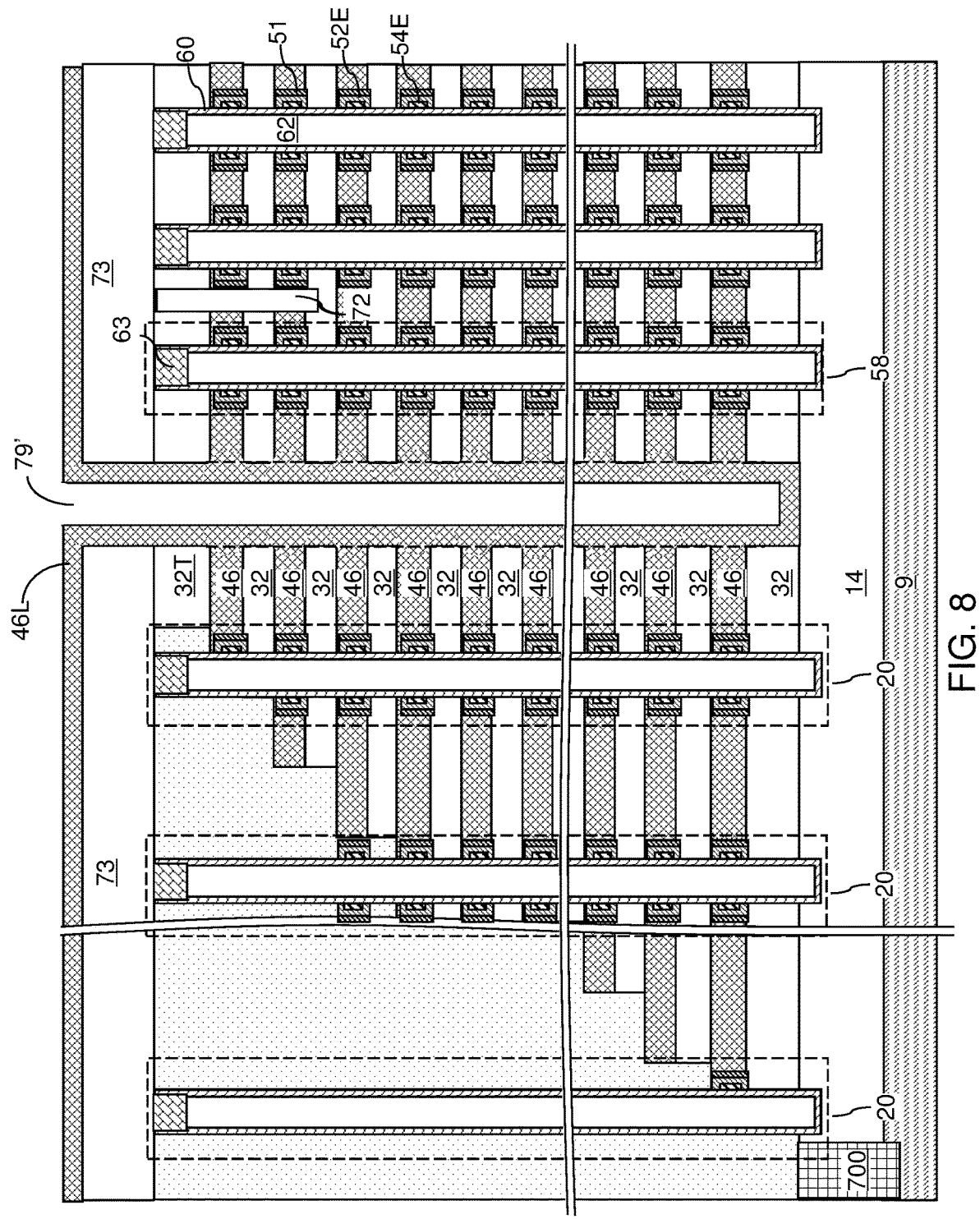
FIG. 8 is a schematic vertical cross-sectional view of the exemplary structure after formation of electrically conductive layers according to an embodiment of the present disclosure.

Referring to FIG. 8, at least one conductive material can be deposited in the backside recesses. In one embodiment, the at least one conductive material may include a combination of a metallic barrier layer and a metal fill material. For example, the metallic barrier layer can be deposited in the backside recesses 43 by a conformal deposition process. The metallic barrier layer includes an electrically conductive metallic material that can function as a diffusion barrier layer and/or adhesion promotion layer for a metallic fill material to be subsequently deposited. The metallic barrier layer can include a conductive metallic nitride material such as TiN, TaN, WN, or a stack thereof, or can include a conductive metallic carbide material such as TiC, TaC, WC, or a stack thereof. In one embodiment, the metallic barrier layer can be deposited by a conformal deposition process such as chemical vapor deposition (CVD) or atomic layer deposition (ALD). The thickness of the metallic barrier layer can be in a range from 2 nm to 8 nm, such as from 3 nm to 6 nm, although lesser and greater thicknesses can also be employed. In one embodiment, the metallic barrier layer can consist essentially of a conductive metal nitride such as TiN.

Subsequently, a metal fill material can be deposited in the plurality of backside recesses 43, on the sidewalls of the at least one the backside trench 79, and over the top surface of the contact level dielectric layer 73 to form a metallic fill material layer. The metallic fill material can be deposited by a conformal deposition method, which can be, for example, chemical vapor deposition (CVD), atomic layer deposition (ALD), electroless plating, electroplating, or a combination thereof. In one embodiment, the metallic fill material layer can consist essentially of at least one elemental metal. The at least one elemental metal of the metallic fill material layer can be selected, for example, from tungsten, cobalt, ruthenium, titanium, and tantalum. In one embodiment, the metallic fill material layer can consist essentially of a single elemental metal. In one embodiment, the metallic fill material layer can be deposited employing a fluorine-containing precursor gas such as $WF_6$. In one embodiment, the metallic fill material layer can be a tungsten layer including a residual level of fluorine atoms as impurities. The metallic fill material layer is spaced from the insulating layers 32 and the memory opening fill structures 58 by the metallic barrier layer, which can block diffusion of fluorine atoms therethrough.

A plurality of electrically conductive layers 46 can be formed in the plurality of backside recesses 43, and a continuous electrically conductive material layer 46L can be formed on the sidewalls of each backside trench 79 and over the contact level dielectric layer 73. Each electrically conductive layer 46 includes a portion of the metallic barrier layer and a portion of the metallic fill material layer that are located between a vertically neighboring pair of dielectric material layers such as a pair of insulating layers 32. The continuous electrically conductive material layer 46L includes a continuous portion of the metallic barrier layer and a continuous portion of the metallic fill material layer that are located in the backside trenches 79 or above the contact level dielectric layer 73. Each sacrificial material layer 42 can be replaced with an electrically conductive layer 46. A backside cavity 79' is present in the portion of each backside trench 79 that is not filled with the continuous electrically conductive material layer 46L. Each electrically conductive layer 46 can function as a word line for an array of ferroelectric memory elements.

Figure 9A:
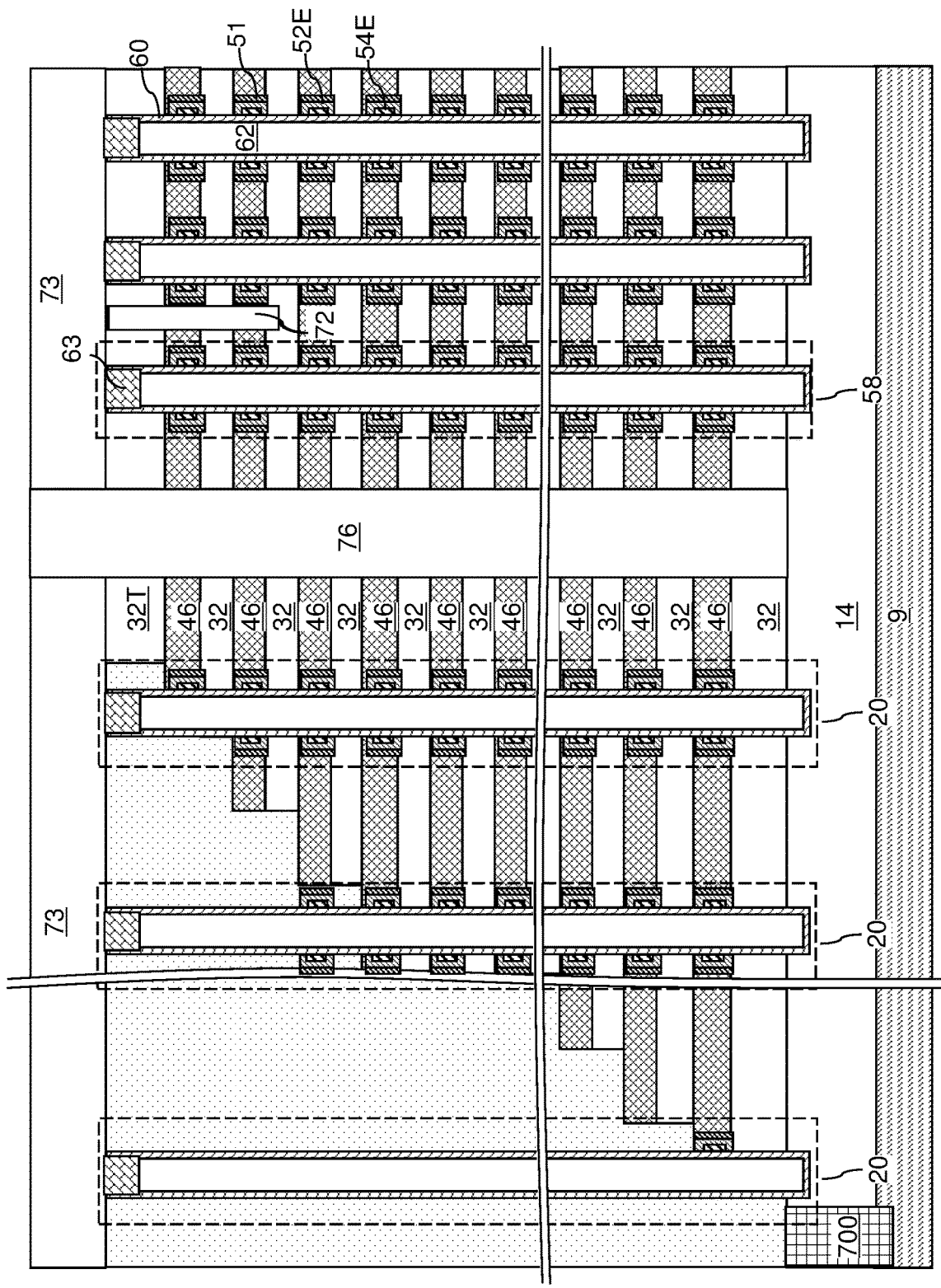
FIG. 9A is a schematic vertical cross-sectional view of the exemplary structure after formation of backside trench fill structures according to an embodiment of the present disclosure.
Figure 9B:
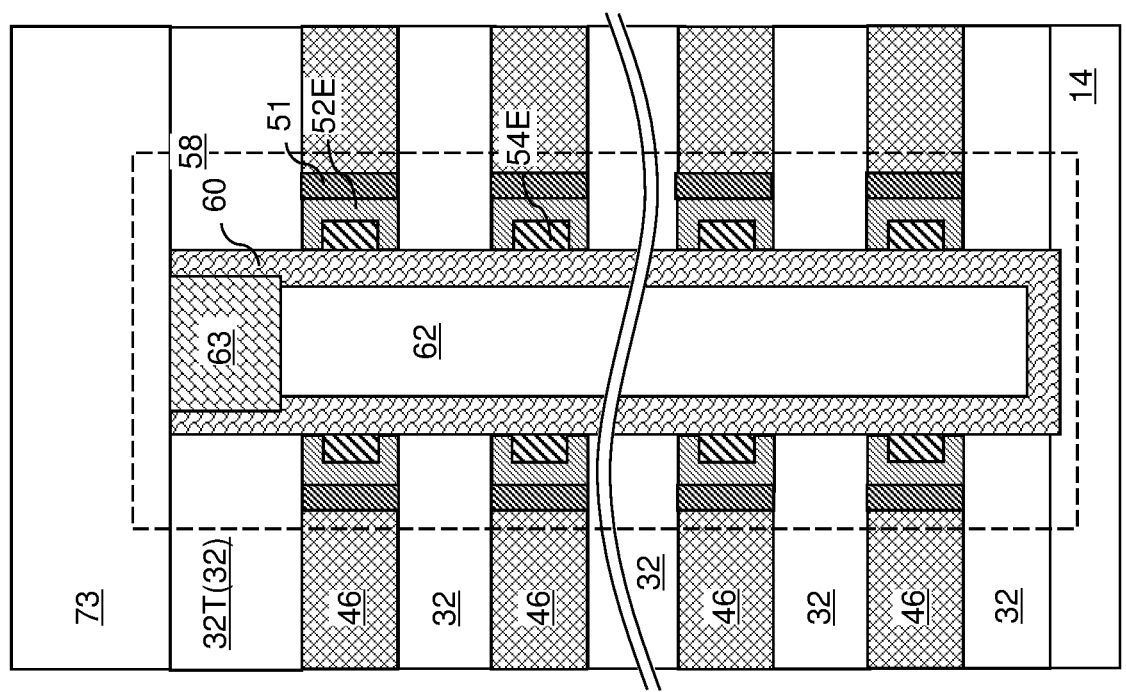
FIG. 9B is a magnified view of a portion of the exemplary structure of FIG. 9A around a memory opening fill structure.

Referring to FIGS. 9A and 9B, the deposited metallic material of the continuous electrically conductive material layer 46L is etched back from the sidewalls of each backside trench 79 and from above the contact level dielectric layer 73, for example, by an isotropic wet etch, an anisotropic dry etch, or a combination thereof. Each remaining portion of the deposited metallic material in the backside recesses 43 constitutes an electrically conductive layer 46. Each electrically conductive layer 46 can be a conductive word line. Thus, the sacrificial material layers 42 are replaced with the electrically conductive layers 46.

A dielectric material such as silicon oxide can be deposited in the backside trenches 79 to form dielectric wall structures 76. Optionally, excess portions of the dielectric material can be removed from above the horizontal plane including the top surface of the topmost insulating layer 32T by a planarization process. In this case, each dielectric wall structure 76 can have a planar top surface, which may be within the same horizontal plane as the top surface of the topmost insulating layer 32T.

Alternatively, a source region is implanted into the semiconductor layer 14 through the backside trench 79. Insulating sidewall spacers can then be formed in the backside trenches 79 and then a source local interconnect (i.e., source electrode) can be formed on the sidewall spacers such that it contacts with the source region. In this alternative configuration, the semiconductor layer 14 functions as a horizontal channel of the memory device.

Figure 10A:
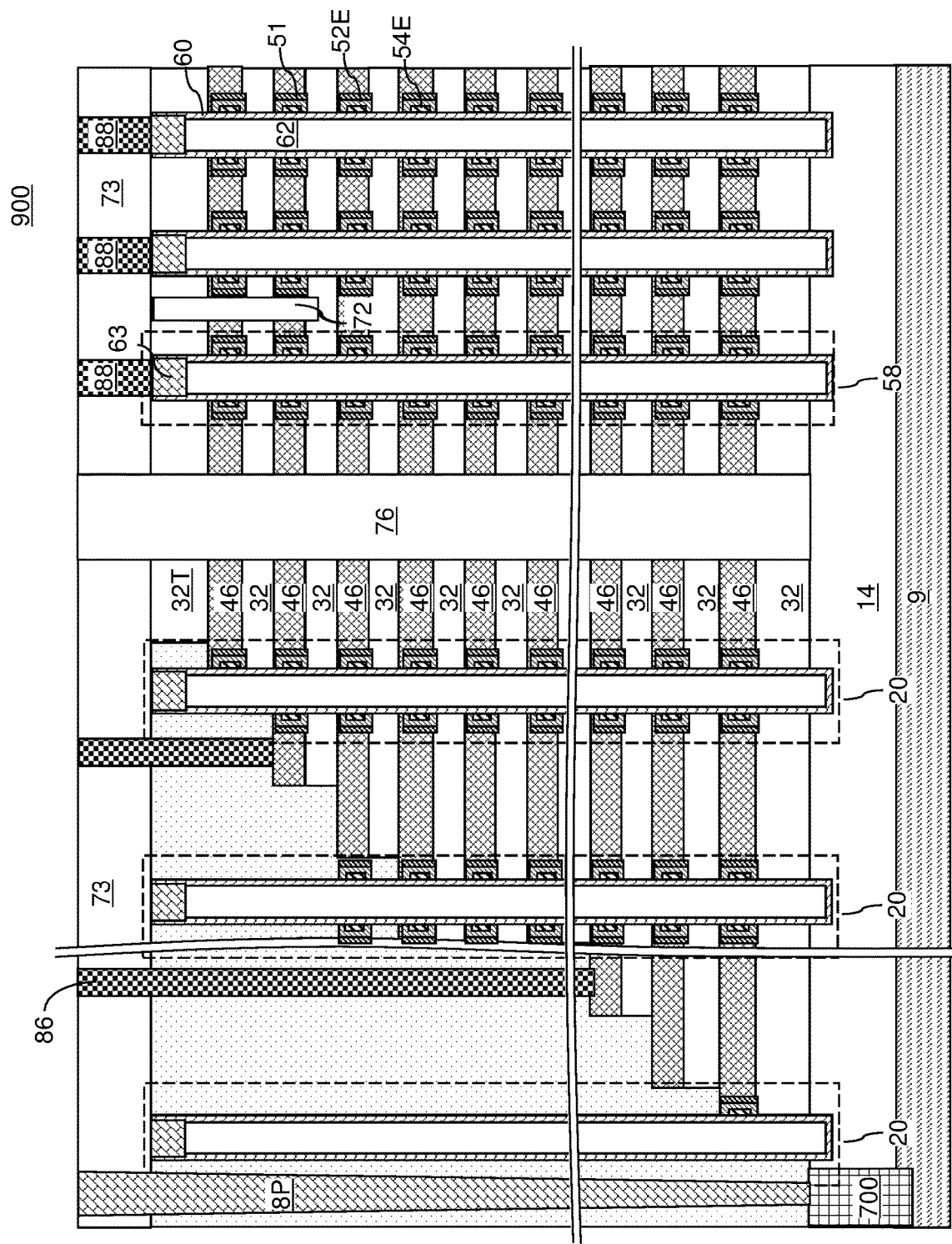
FIG. 10A is a schematic vertical cross-sectional view of the exemplary structure after formation of contact via structures according to an embodiment of the present disclosure.
Figure 10B:
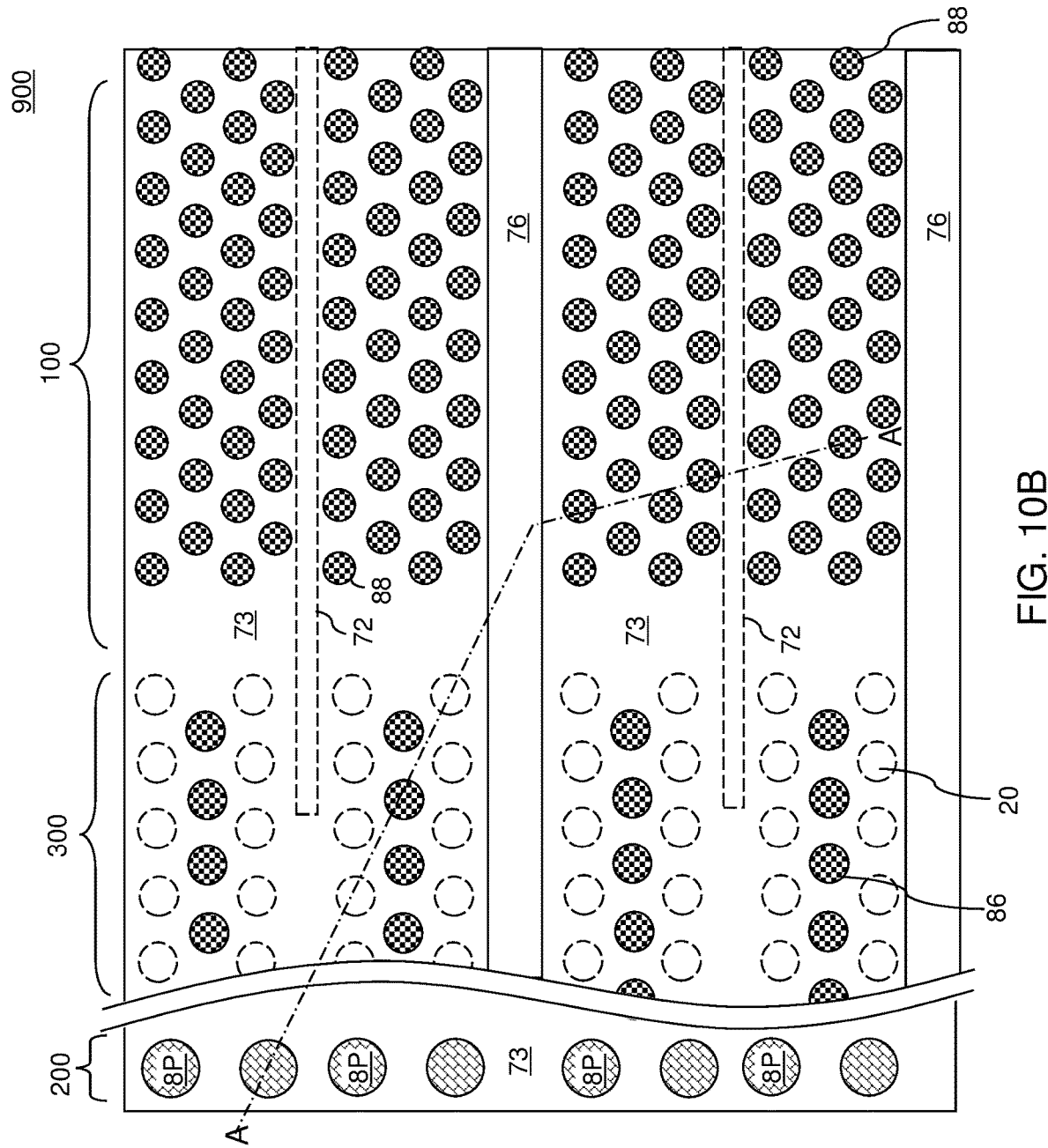
FIG. 10B is a top-down view of the exemplary structure of FIG. 10A. The vertical plane A-A' is the plane of the schematic vertical cross-sectional view of FIG. 10A.

Referring to FIGS. 10A and 10B, contact via structures (88, 86, 8P) can be formed through the contact level dielectric layer 73, and optionally through the retro-stepped dielectric material portion 65. For example, drain contact via structures 88 can be formed through the contact level dielectric layer 73 on each semiconductor drain region 63. Word line contact via structures 86 can be formed on the electrically conductive layers 46 through the contact level dielectric layer 73, and through the retro-stepped dielectric material portion 65. Peripheral device contact via structures 8P can be formed through the retro-stepped dielectric material portion 65 directly on respective nodes of the peripheral devices 700. Bit lines (not shown for clarity) are then formed in electrical contact with the drain contact via structures 88. This completes the formation of the three-dimensional ferroelectric memory device 900.

FIGS. 11A-11D are sequential vertical cross-sectional views of a memory opening 49 during formation of a memory opening fill structure 58 in a second configuration according to an embodiment of the present disclosure.

Figure 11A:
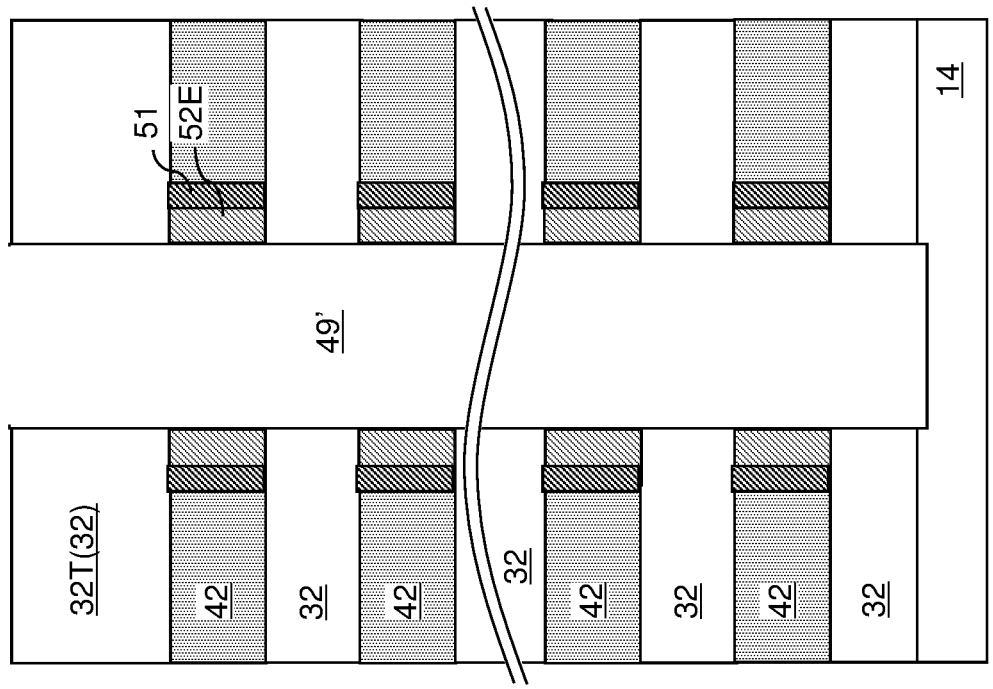
FIGS. 11A-11D are sequential vertical cross-sectional views of a memory opening during formation of a memory opening fill structure in a second configuration according to an embodiment of the present disclosure.

Referring to FIG. 11A, a memory opening is illustrated at the processing step of FIG. 4E. In other words, a structure for forming the second configuration for the memory opening fill structure 58 at the processing step of FIG. 11A can be the same as a structure for forming the first configuration for the memory opening fill structure 58 that is illustrated in FIG. 4E. A memory cavity 49', which is an unfilled volume of a memory opening 49, is present within each memory opening 49.

Figure 11B:
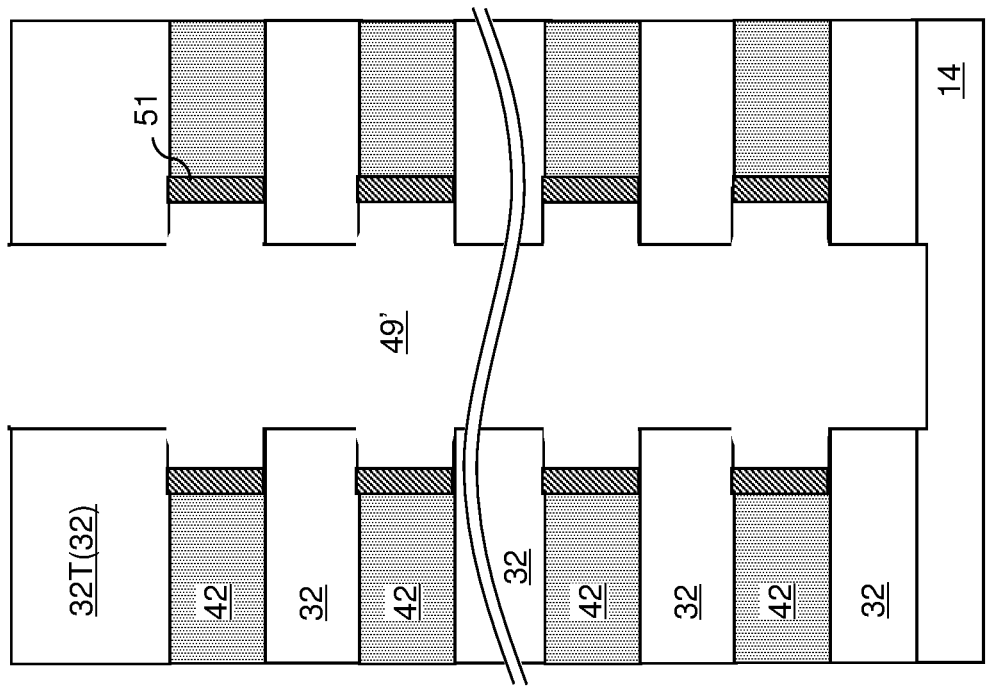

Referring to FIG. 11B, the processing steps of FIG. 4F can be performed to deposit a second template material layer 52L with a modification such that the entire volume of the lateral recesses 49R is filled with the combination of the crystalline template structures 51 and the second template material layer 52L. An anisotropic etch process can be subsequently performed to remove portions of the second template material layer 52L that are present outside the volumes of the lateral recesses 49R. Each remaining portion of the second template material layer 52L that is located within a respective one of the lateral recesses 49R comprise an epitaxial template portion 52E. In one embodiment, each epitaxial template portion 52E can have an annular cylindrical configuration, and an inner cylindrical sidewall of each epitaxial template portion 52E can be vertically coincident with sidewalls of insulating material layers 32 located around the memory opening 49. In one embodiment, each epitaxial template portion 52E may be a polycrystalline template portion.

Figure 11D:
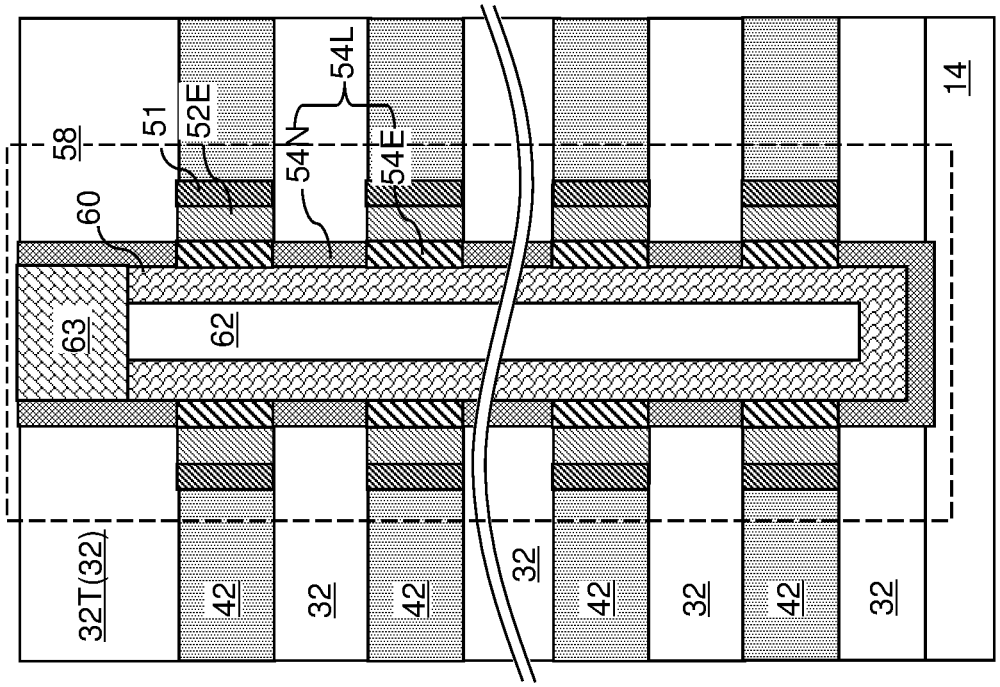
Figure 11C:
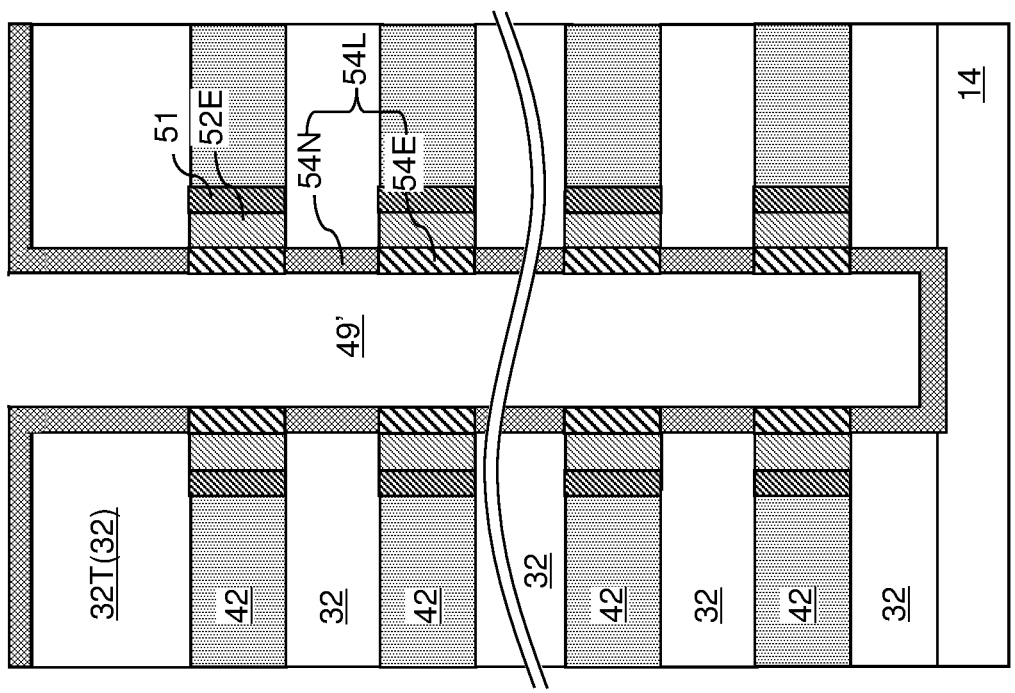

Referring to FIG. 11C, the above described dielectric material layer 54L including the dielectric material having the ferroelectric phase and at least one non-ferroelectric phase can be conformally deposited over the epitaxial template portions 52E and the insulating material layers 32. The process temperature for deposition of the dielectric material layer 54L is selected such that portions of the dielectric material that are formed directly on surfaces of the epitaxial template portions 52E are deposited in the ferroelectric crystalline phase in epitaxial alignment with a respective one of the epitaxial template portions 52E. Such ferroelectric crystalline phase material portions are subsequently employed as memory material portions, and are herein referred to as crystalline ferroelectric memory material portions 54E. Generally, a crystalline ferroelectric memory material portion 54E can be formed on each of the epitaxial template portions 52E. Each of the crystalline ferroelectric memory material portions 54E is epitaxially aligned to crystallographic grain(s) of a respective one of the epitaxial template portions 52E.

The dielectric material layer 54L also includes portions that are formed on surfaces of the insulating layers 32 or the semiconductor layer 14. The portions of the dielectric material layer 54L that are formed on the surfaces of the insulating layers 32 or the semiconductor layer 14 are herein referred to as dielectric material portions 54N. The dielectric material portions 54N have a same material composition as the crystalline ferroelectric memory material portions 54E. A vertical stack of dielectric material portions 54N can be vertically interlaced with a vertical stack of crystalline ferroelectric memory material portions 54E. In one embodiment, the vertical stack of dielectric material portions 54N may be not ferroelectric and may be amorphous. In one embodiment, the crystalline ferroelectric memory material portions 54E comprise, and/or consist essentially of, doped hafnium oxide, such as hafnium zirconium oxide, silicon doped hafnium oxide or aluminum doped hafnium oxide.

Generally, the crystalline ferroelectric memory material portions 54E can be formed by conformally depositing a dielectric material layer 54L including a dielectric material having a ferroelectric phase and at least one non-ferroelectric phase over the crystalline template structures 51 and the epitaxial template portions 52E. Portions of the dielectric material layer 54L that are formed in epitaxial alignment with the epitaxial template portions 52E comprise the crystalline ferroelectric memory material portions 54E. Portions of the dielectric material layer 54L that contact the insulating layers 32 comprise dielectric material portions 54N that are not ferroelectric and may be amorphous.

Referring to FIG. 11D, a doped semiconductor material can be conformally deposited within the memory openings 49 to form a semiconductor channel layer 60L, which can have the same material composition and the thickness range as described above. A dielectric fill material such as silicon oxide can be deposited in remaining unfilled volumes of the memory openings 49. Excess portions of the dielectric fill material, the semiconductor channel layer 60L, and the dielectric material layer 54L can be removed from above a horizontal plane including the top surface of the topmost insulating layer 32T by a planarization process. The planarization process can employ a recess etch and/or a chemical mechanical polishing (CMP) process. Each remaining portion of the semiconductor channel layer 60L constitutes a vertical semiconductor channel 60, which can function as vertical bit lines for a three-dimensional ferroelectric memory device. Each remaining portion of the dielectric fill material constitutes a dielectric core 62. The semiconductor drain regions 63 are then formed as described above.

The set of all material portions that fill a memory opening 49 constitutes a memory opening fill structure 58. Each memory opening fill structure 58 can include a vertical semiconductor channel 60, a semiconductor drain region 63, and a vertical stack of memory elements (51, 52E, 54E) interlaced with a vertical stack of non-epitaxial dielectric material portions 54N. Thus, each memory opening fill structure 58 can include a vertical stack of dielectric material portions 54N, which may not be ferroelectric and may be in a different phase (e.g., may be in the amorphous phase) than the crystalline ferroelectric memory material portions 54E. The vertical stack of dielectric material portions 54N comprises a same material composition as the crystalline ferroelectric memory material portions 54E, and is vertically interlaced with the vertical stack of memory elements (51, 52E, 54E). The vertical stack of dielectric material portions 54N may not be ferroelectric, and/or may be amorphous or polycrystalline having grains with random (i.e., non-textured) crystallographic orientations. Thus, the non-epitaxial dielectric material portions 54N are retained in the final memory device in this embodiment. Support pillar structures are formed in the support openings 19 concurrently with formation of memory opening fill structures 58 in the memory openings 49 during the processing steps of FIGS. 4A-4D and 11A-11D.

Figure 11F:
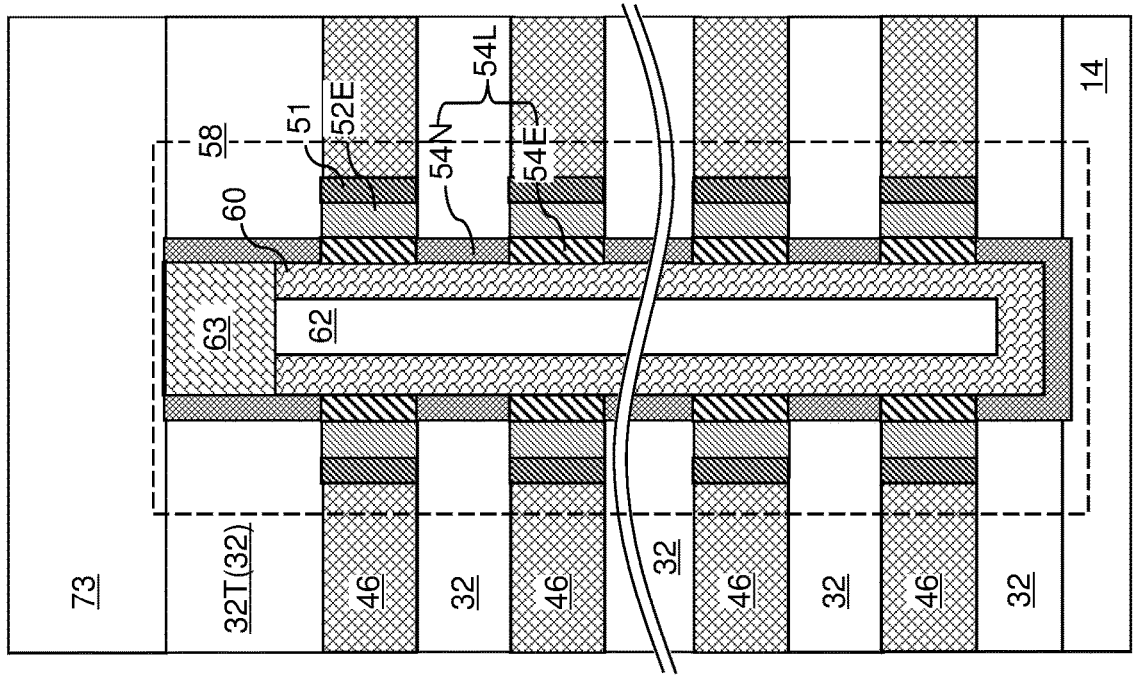
FIGS. 11E and 11F are sequential vertical cross-sectional views of a memory opening including a memory opening fill structure in the second configuration during replacement of sacrificial material layers with electrically conductive layers according to an embodiment of the present disclosure.
Figure 11E:
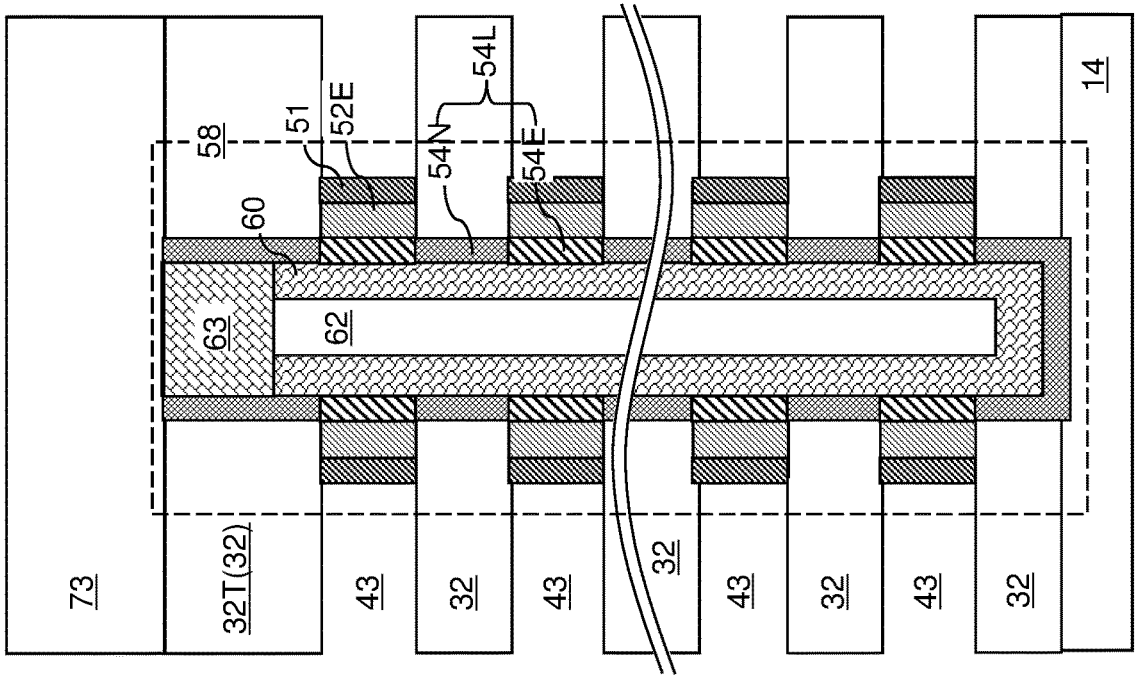

FIGS. 11E and 11F are sequential vertical cross-sectional views of a memory opening including a memory opening fill structure in the second configuration during replacement of sacrificial material layers 42 with electrically conductive layers 46 according to an embodiment of the present disclosure.

Referring to FIG. 11E, the processing steps of FIGS. 6A, 6B, 7A, and 7B can be performed to form backside recesses 43.

Referring to FIG. 11F, the processing steps of FIG. 8 can be performed to form electrically conductive layers 46. Subsequently, the processing steps of FIGS. 9A and 9B, and the processing steps of FIGS. 10A and 10B can be performed.

Figure 11G:
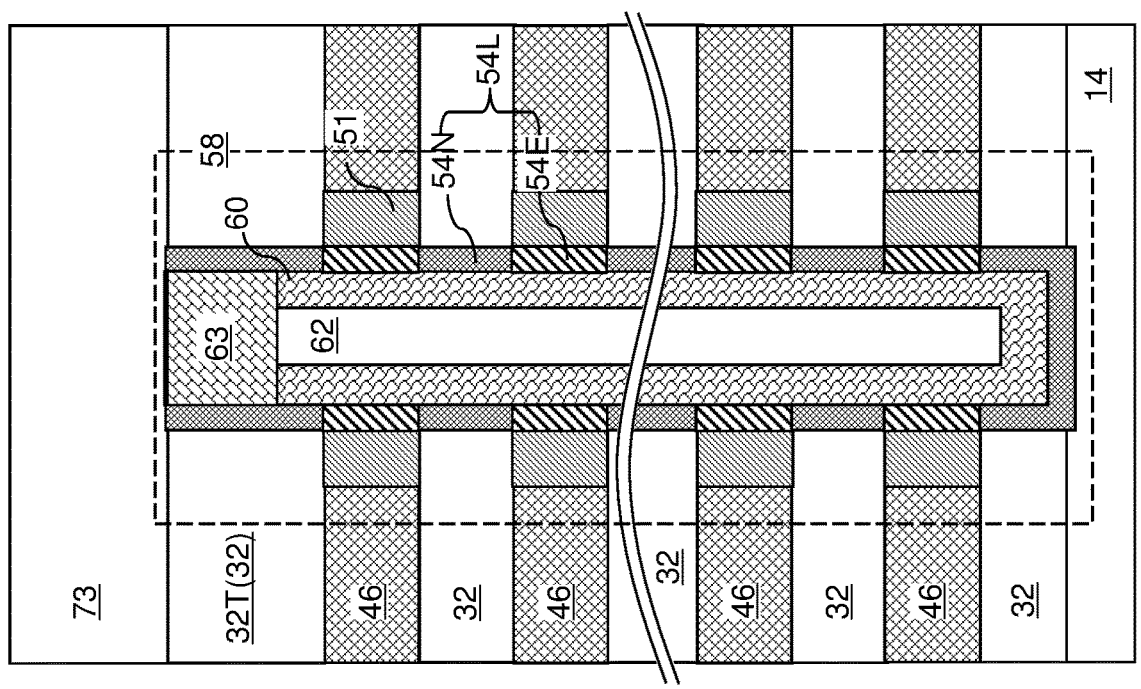
FIG. 11G is a vertical cross-sectional view of an alternative second configuration of the memory opening fill structure according to another alternative embodiment of the present disclosure.

FIG. 11G illustrates an alternative second configuration of the memory opening fill structure 58 according to another alternative embodiment of the present disclosure. In this alternative embodiment, the epitaxial template portion 52E of FIG. 11F is omitted and the crystalline ferroelectric memory material portion 54E is formed directly on and is epitaxially aligned to crystallographic grain(s) of the crystalline template structure 51. The crystalline template structure 51 may comprise and/or consist essentially of yttria stabilized zirconia. In this alternative embodiment, the crystalline template structure 51 may have a clam shape or a cylindrical shape described above.

FIGS. 12A and 12B are sequential vertical cross-sectional views of a memory opening including a memory opening fill structure in a third configuration during replacement of sacrificial material layers with electrically conductive layers according to an embodiment of the present disclosure.

Referring to FIG. 12A, the third configuration of the exemplary structure can be derived from the first configuration of the exemplary structure illustrated in FIGS. 7A and 7B by performing an isotropic etch process that etches the crystalline template structures 51 without etching the epitaxial template portions 52E. In one embodiment, a selective isotropic etch process may be employed, which etches the material of the crystalline template structures 51 and does not etch the material of the epitaxial template portions 52E. In another embodiment, a timed isotropic etch process may be employed such that the isotropic etch process etches the material of the crystalline template structures 51 completely without significantly etching the material of the epitaxial template portions 52E. Outer cylindrical sidewalls of the epitaxial template portions 52E can be physically exposed to the backside recesses 43. In one embodiment, each epitaxial template portion 52E may be a polycrystalline template portion.

Referring to FIG. 12B, the processing steps of FIG. 8 can be performed to form electrically conductive layers 46. In this case, each electrically conductive layer 46 can be formed directly on outer cylindrical sidewalls of a respective subset of the epitaxial template portions 52E. In this case, each epitaxial template portion 52E may comprise an outer sidewall that contacts a cylindrical sidewall of the respective one of the electrically conductive layers 46.

Subsequently, the processing steps of FIGS. 9A and 9B can be performed, and the processing steps of FIGS. 10A and 10B can be performed.

Figure 13A:
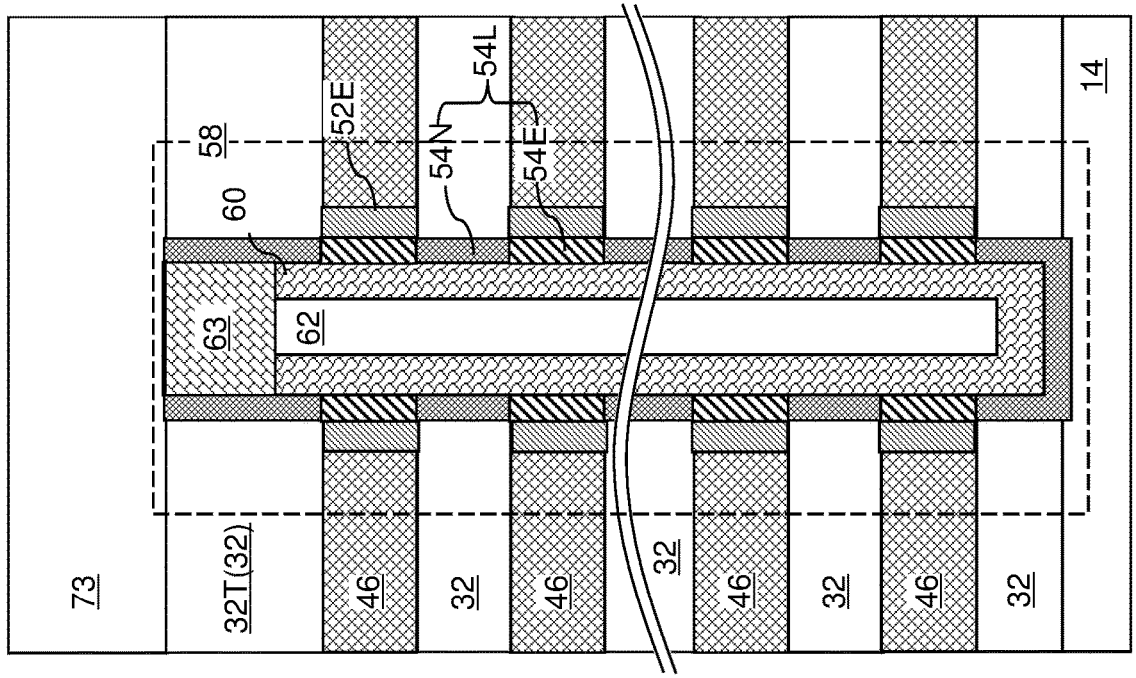
FIGS. 13A and 13B are sequential vertical cross-sectional views of a memory opening including a memory opening fill structure in a fourth configuration during replacement of sacrificial material layers with electrically conductive layers according to an embodiment of the present disclosure.
Figure 13B:
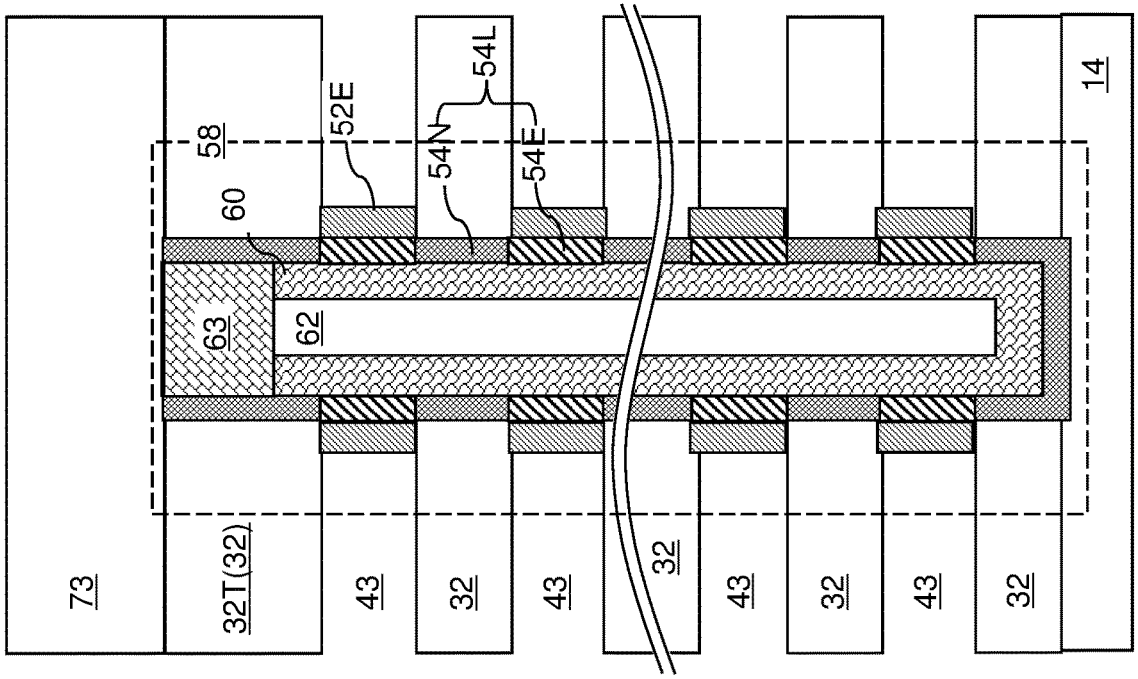

FIGS. 13A and 13B are sequential vertical cross-sectional views of a memory opening including a memory opening fill structure in a fourth configuration during replacement of sacrificial material layers with electrically conductive layers according to an embodiment of the present disclosure.

Referring to FIG. 13A, the fourth configuration of the exemplary structure can be derived from the second configuration of the exemplary structure illustrated in FIG. 11E by performing an isotropic etch process that etches the crystalline template structures 51 without etching the epitaxial template portions 52E. In one embodiment, a selective isotropic etch process may be employed, which etches the material of the crystalline template structures 51 and does not etch the material of the epitaxial template portions 52E. In another embodiment, a timed isotropic etch process may be employed such that the isotropic etch process etches the material of the crystalline template structures 51 completely without significantly etching the material of the epitaxial template portions 52E. Outer cylindrical sidewalls of the epitaxial template portions 52E can be physically exposed to the backside recesses 43. In one embodiment, each epitaxial template portion 52E may be a polycrystalline template portion.

Referring to FIG. 13B, the processing steps of FIG. 8 can be performed to form electrically conductive layers 46. In this case, each electrically conductive layer 46 can be formed directly on outer cylindrical sidewalls of a respective subset of the epitaxial template portions 52E. In this case, each epitaxial template portion 52E may comprise an outer sidewall that contacts a cylindrical sidewall of the respective one of the electrically conductive layers 46.

Subsequently, the processing steps of FIGS. 9A and 9B can be performed, and the processing steps of FIGS. 10A and 10B can be performed.

Figure 14:
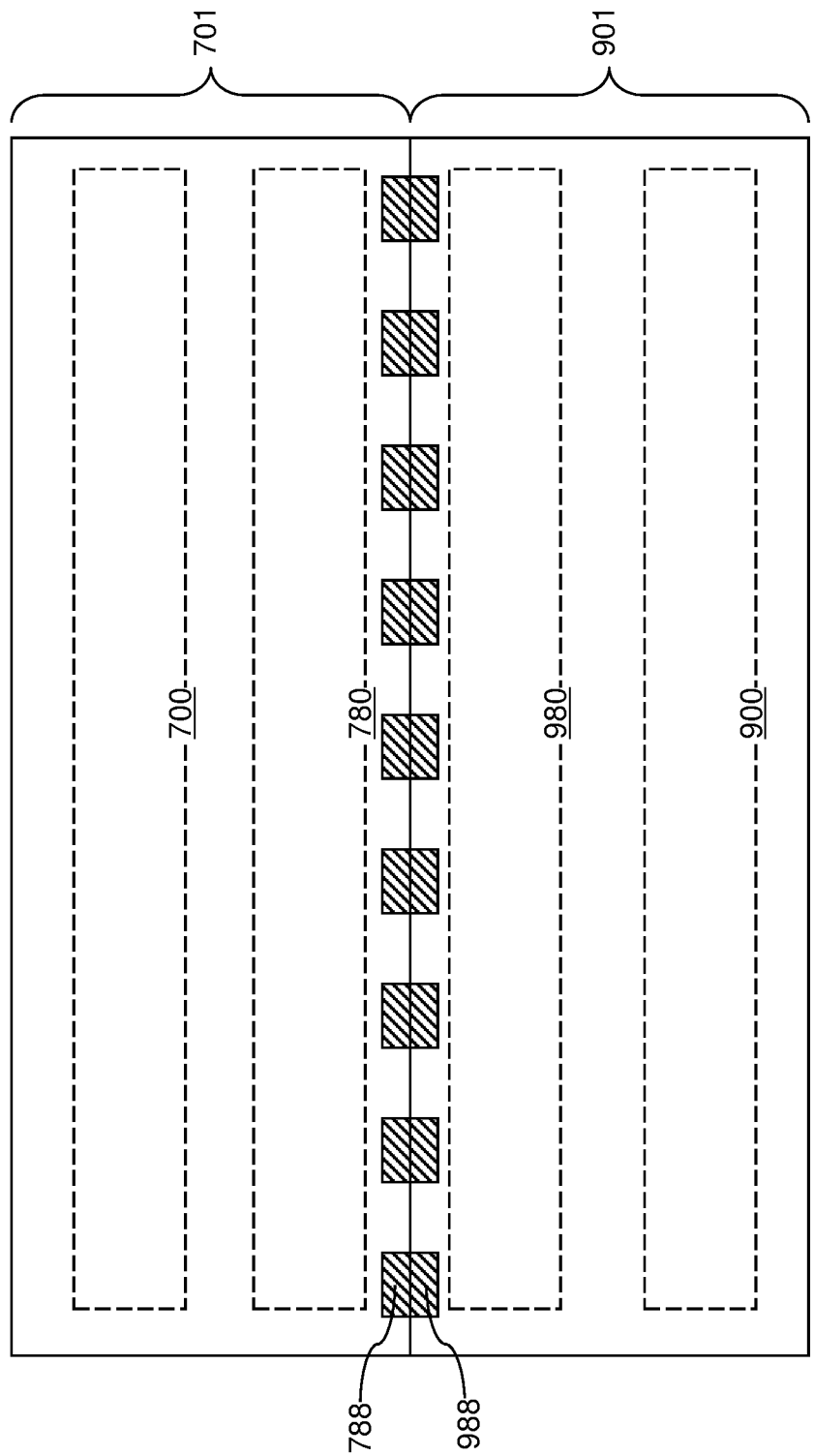
FIG. 14 is a vertical cross-sectional view of a bonded assembly including a memory die and a logic die according to an embodiment of the present disclosure.

Referring to FIG. 14, a vertical cross-sectional view of a bonded assembly is illustrated, which includes a memory die 901 and a logic die 701 according to an embodiment of the present disclosure. The memory die 901 includes a three-dimensional memory device 900, which may be derived from any of the previously described exemplary structure by omitting formation of peripheral devices 700 of the peripheral (i.e., driver) circuit. Instead, peripheral devices 700 of the peripheral circuit are formed in the logic die 701 on a separate substrate from the three-dimensional ferroelectric memory device 900 described above. Memory-side metal interconnect structures 980 embedded in memory-side dielectric material layers can be formed over the three-dimensional memory device 900. Memory-side bonding pads 988 can be formed at the topmost level of the memory-side dielectric material layers. The memory-side bonding pads 998 can be electrically connected to various nodes of the three-dimensional memory device 900 by the memory-side metal interconnect structures 980. Logic-side metal interconnect structures 780 embedded in logic-side dielectric material layers can be formed over the peripheral devices 700, which form the peripheral circuit. The peripheral circuit can be configured to control operation of the three-dimensional ferroelectric memory device 900, which includes a three-dimensional ferroelectric memory array. Logic-side bonding pads 788 can be formed at the topmost level of the logic-side dielectric material layers. The logic-side bonding pads 778 can be electrically connected to various nodes of the peripheral devices 700 by the logic-side metal interconnect structures 780. The logic-side bonding pads 788 can be bonded to the memory-side bonding pads 989, for example, via metal-to-metal bonding.

Referring to all drawings and according to various embodiments of the present disclosure, a ferroelectric memory device is provided, which comprises: an alternating stack of insulating layers 32 and electrically conductive layers 46; a memory opening 49 vertically extending through the alternating stack (32, 46); and a memory opening fill structure 58 located in the memory opening 49 and comprising a vertical stack of memory elements (51, 52E, 54E) and a vertical semiconductor channel 60, wherein each memory element (51, 52E, 54E) within the vertical stack of memory elements (51, 52E, 54E) comprises a crystalline ferroelectric memory material portion 54E and an epitaxial template portion 52E.

In one embodiment, the crystalline ferroelectric memory material portion 54E is single crystalline. In another embodiment, the crystalline ferroelectric memory material portion 54E is polycrystalline and each grain in the crystalline ferroelectric memory material portion 54E is epitaxially aligned to a respective grain of the epitaxial template portion 52E.

In one embodiment, the crystalline ferroelectric memory material portion 54E has an annular cylindrical shape; and an inner cylindrical sidewall of the crystalline ferroelectric memory material portion 54E contacts the vertical semiconductor channel 60.

In one embodiment, the crystalline ferroelectric memory material portion 54E is vertically spaced from an overlying one of the insulating layers 32 and an underlying one of the insulating layers 32 by horizontally-extending portions (such as a top annular portion and a bottom annular portion) of the epitaxial template portion 52E.

In one embodiment, the ferroelectric memory device comprises a vertical stack of non-epitaxial dielectric material portions 54N having a same material composition as the crystalline ferroelectric memory material portions 54E and vertically interlaced with the vertical stack of memory elements (51, 52E, 54E), wherein the vertical stack of non-epitaxial dielectric material portions 54N is not ferroelectric, and is amorphous or polycrystalline with random crystallographic orientations.

In one embodiment, each memory element (51, 52E, 54E) within the vertical stack of memory elements (51, 52E, 54E) comprises a crystalline template structure 51 contacting an outer cylindrical sidewall of the epitaxial template portion 52E.

In one embodiment, an outer sidewall of the crystalline template structure 51 contacts a cylindrical sidewall of a respective one of the electrically conductive layers 46. In one embodiment, the crystalline template structure 51 comprises yttria stabilized zirconia and the epitaxial template portion 52E comprises indium tin oxide, lead iridium oxide or a bilayer comprising titanium nitride and titanium oxide.

In one embodiment, the epitaxial template portion 52E comprises an outer sidewall that contacts a cylindrical sidewall of the respective one of the electrically conductive layers 46.

In one embodiment, the epitaxial template portion 52E comprises a material selected from yttria stabilized zirconia, indium tin oxide, lead iridium oxide, or a bilayer comprising titanium nitride and titanium oxide, and the crystalline ferroelectric memory material portion comprises orthorhombic phase, doped hafnium oxide. In one embodiment, the crystalline ferroelectric memory material portions 54E comprise orthorhombic phase hafnium zirconium oxide.

In one embodiment, the crystalline ferroelectric memory material portion 54E has a radial dipole moment that is parallel to or is antiparallel to a radial direction extending radially and horizontally from a vertical axis passing through a geometrical center of the memory opening 49.

Although the foregoing refers to particular embodiments, it will be understood that the disclosure is not so limited. It will occur to those of ordinary skill in the art that various modifications may be made to the disclosed embodiments and that such modifications are intended to be within the scope of the disclosure. Compatibility is presumed among all embodiments that are not alternatives of one another. The word "comprise" or "include" contemplates all embodiments in which the word "consist essentially of" or the word "consists of" replaces the word "comprise" or "include," unless explicitly stated otherwise. Where an embodiment using a particular structure and/or configuration is illustrated in the present disclosure, it is understood that the present disclosure may be practiced with any other compatible structures and/or configurations that are functionally equivalent provided that such substitutions are not explicitly forbidden or otherwise known to be impossible to one of ordinary skill in the art. All of the publications, patent applications and patents cited herein are incorporated herein by reference in their entirety.

What is claimed is:

1. A ferroelectric memory device, comprising:
an alternating stack of insulating layers and electrically conductive layers;
a memory opening vertically extending through the alternating stack; and
a memory opening fill structure located in the memory opening and comprising a vertical stack of memory elements and a vertical semiconductor channel, wherein each memory element within the vertical stack of memory elements comprises a crystalline ferroelectric memory material portion and an epitaxial template portion,
wherein one of the electrically conductive layers comprise a horizontal top surface that is in direct contact with a horizontal bottom surface of an overlying insulating layer of the insulating layers.

2. The ferroelectric memory device of claim 1, wherein the crystalline ferroelectric memory material portion is single crystalline.

3. The ferroelectric memory device of claim 1, wherein the crystalline ferroelectric memory material portion is polycrystalline and each grain in the crystalline ferroelectric memory material portion is epitaxially aligned to a respective grain of the epitaxial template portion.

4. The ferroelectric memory device of claim 1, wherein:
the crystalline ferroelectric memory material portion has an annular cylindrical shape; and
an inner cylindrical sidewall of the crystalline ferroelectric memory material portion contacts the vertical semiconductor channel.

5. The ferroelectric memory device of claim 1, wherein the epitaxial template portion comprises an outer sidewall that contacts a cylindrical sidewall of the respective one of the electrically conductive layers.

6. A ferroelectric memory device, comprising:
an alternating stack of insulating layers and electrically conductive layers;
a memory opening vertically extending through the alternating stack; and
a memory opening fill structure located in the memory opening and comprising a vertical stack of memory elements and a vertical semiconductor channel, wherein each memory element within the vertical stack of memory elements comprises a crystalline ferroelectric memory material portion and an epitaxial template portion,
wherein:
the epitaxial template portion comprises a material selected from yttria stabilized zirconia, indium tin oxide, lead iridium oxide, or a bilayer comprising titanium nitride and titanium oxide; and
the crystalline ferroelectric memory material portion comprises orthorhombic phase, doped hafnium oxide.

7. The ferroelectric memory device of claim 1, wherein the crystalline ferroelectric memory material portion comprises orthorhombic phase hafnium zirconium oxide.

8. The ferroelectric memory device of claim 1, wherein the crystalline ferroelectric memory material portion has a radial dipole moment that is parallel to or is antiparallel to a radial direction extending radially and horizontally from a vertical axis passing through a geometrical center of the memory opening.

9. The ferroelectric memory device of claim 1, wherein the one of the electrically conductive layers comprises a horizontal bottom surface that is in direct contact with a horizontal top surface of an underlying insulating layer of the insulating layers.

10. The ferroelectric memory device of claim 1, wherein:
each of the electrically conductive layers comprise a respective horizontal top surface that is in direct contact with a horizontal bottom surface of a respective overlying insulating layer of the insulating layers; and
each of the electrically conductive layers comprise a respective horizontal bottom surface that is in direct contact with a horizontal top surface of a respective underlying insulating layer of the insulating layers.

11. The ferroelectric memory device of claim 1, further comprising:
a backside trench vertically extending through the alternating stack; and
a backside trench fill structure located in the backside trench, wherein each of the epitaxial template portions does not contact the backside trench fill structure, and is laterally spaced from the backside trench fill structure by portions of the electrically conductive layers.

12. The ferroelectric memory device of claim 1, wherein each of the electrically conductive layers is located at a same level as and has a same vertical extent as a respective one of the epitaxial template portions.

13. The ferroelectric memory device of claim 1, wherein each of the electrically conductive layers is located at a same level as and has a greater vertical extent than a respective one of the epitaxial template portions.

14. A ferroelectric memory device, comprising:
an alternating stack of insulating layers and electrically conductive layers;
a memory opening vertically extending through the alternating stack; and
a memory opening fill structure located in the memory opening and comprising a vertical stack of memory elements and a vertical semiconductor channel, wherein each memory element within the vertical stack of memory elements comprises a crystalline ferroelectric memory material portion and an epitaxial template portion,
wherein the crystalline ferroelectric memory material portion is vertically spaced from an overlying one of the insulating layers and an underlying one of the insulating layers by horizontally-extending portions of the epitaxial template portion.

15. The ferroelectric memory device of claim 1, further comprising a vertical stack of non-epitaxial dielectric material portions having a same material composition as the crystalline ferroelectric memory material portions and vertically interlaced with the vertical stack of memory elements, wherein the vertical stack of non-epitaxial dielectric material portions is not ferroelectric and is amorphous or polycrystalline with random crystallographic orientations.

16. A ferroelectric memory device, comprising:
an alternating stack of insulating layers and electrically conductive layers;
a memory opening vertically extending through the alternating stack; and
a memory opening fill structure located in the memory opening and comprising a vertical stack of memory elements and a vertical semiconductor channel, wherein each memory element within the vertical stack of memory elements comprises a crystalline ferroelectric memory material portion and an epitaxial template portion,
wherein each memory element within the vertical stack of memory elements comprises a crystalline template structure contacting an outer cylindrical sidewall of the epitaxial template portion.

17. The ferroelectric memory device of claim 16, wherein an outer sidewall of the crystalline template structure contacts a cylindrical sidewall of a respective one of the electrically conductive layers.

18. The ferroelectric memory device of claim 16, wherein the crystalline template structure comprises yttria stabilized zirconia and the epitaxial template portion comprises indium tin oxide, lead iridium oxide or a bilayer comprising titanium nitride and titanium oxide.

19. The ferroelectric memory device of claim 6, wherein the epitaxial template portion comprises the yttria stabilized zirconia.

20. The ferroelectric memory device of claim 6, wherein the epitaxial template portion comprises the indium tin oxide.

* * * * *